United States Patent
Fujiwara et al.

(10) Patent No.: US 8,598,685 B2
(45) Date of Patent: Dec. 3, 2013

(54) GAN SINGLE CRYSTAL SUBSTRATE AND METHOD OF MANUFACTURING THEREOF AND GAN-BASED SEMICONDUCTOR DEVICE AND METHOD OF MANUFACTURING THEREOF

(75) Inventors: Shinsuke Fujiwara, Itami (JP); Koji Uematsu, Itami (JP); Hideki Osada, Itami (JP); Seiji Nakahata, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 348 days.

(21) Appl. No.: 12/817,753

(22) Filed: Jun. 17, 2010

(65) Prior Publication Data

US 2011/0057197 A1 Mar. 10, 2011

(30) Foreign Application Priority Data

Sep. 4, 2009 (JP) ................... 2009/204977
Sep. 4, 2009 (JP) ................... 2009-204978
Sep. 30, 2009 (JP) ................... 2009-227496

(51) Int. Cl.
*H01L 29/20* (2006.01)

(52) U.S. Cl.
USPC .............. 257/615; 257/E21.09; 257/E33.003; 257/E33.023

(58) Field of Classification Search
USPC ....... 257/11, 64, 189, 631, E33.003, 257/E33.023, E33.025, E31.059, E27.012, 257/E29.249, E21.365, E29.003
See application file for complete search history.

(56) References Cited

U.S. PATENT DOCUMENTS

| | | | |
|---|---|---|---|
| 2001/0030328 A1* | 10/2001 | Ishida | 257/103 |
| 2007/0093073 A1 | 4/2007 | Farrell, Jr. et al. | |
| 2008/0272377 A1* | 11/2008 | Nakahata | 257/76 |
| 2009/0127664 A1* | 5/2009 | Okahisa et al. | 257/615 |

FOREIGN PATENT DOCUMENTS

| | | | |
|---|---|---|---|
| JP | 622789 A | | 8/1994 |
| JP | 2002-299741 | | 10/2002 |
| JP | 2002299741 A | * | 10/2002 |
| JP | 2005-101475 | | 4/2005 |
| JP | 2006-052102 | | 2/2006 |
| JP | 2006315947 A | | 11/2006 |
| JP | 2008-143772 | | 6/2008 |
| JP | 2008543089 A | | 11/2008 |
| JP | 2009073704 | | 4/2009 |

OTHER PUBLICATIONS

An English machine translation of Uematsu (JP 2002299741 A) is provided in the office action.*

* cited by examiner

*Primary Examiner* — Daniel Luke
*Assistant Examiner* — Khaja Ahmad
(74) *Attorney, Agent, or Firm* — Drinker Biddle & Reath LLP

(57) ABSTRACT

A GaN single crystal substrate has a main surface with an area of not less than 10 cm$^2$, the main surface has a plane orientation inclined by not less than 65° and not more than 85° with respect to one of a (0001) plane and a (000-1) plane, and the substrate has at least one of a substantially uniform distribution of a carrier concentration in the main surface, a substantially uniform distribution of a dislocation density in the main surface, and a photoelasticity distortion value of not more than 5×10$^{-5}$, the photoelasticity distortion value being measured by photoelasticity at an arbitrary point in the main surface when light is applied perpendicularly to the main surface at an ambient temperature of 25° C. Thus, the GaN single crystal substrate suitable for manufacture of a GaN-based semiconductor device having a small variation of characteristics can be obtained.

15 Claims, 7 Drawing Sheets

(A)

(B)

(C)

(D)

(A)

(B)

(C)

(A)

(B)

(C)

(D)

(A)

(B)

(C)

GAN SINGLE CRYSTAL SUBSTRATE AND METHOD OF MANUFACTURING THEREOF AND GAN-BASED SEMICONDUCTOR DEVICE AND METHOD OF MANUFACTURING THEREOF

BACKGROUND OF THE INVENTION

1. Field of the Invention

The present invention relates to a GaN single crystal substrate suitable for manufacture of a GaN-based semiconductor device having characteristics with small variations, specifically to a GaN single crystal substrate having a large area and a main surface whose plane orientation is other than (0001) and (000-1) (namely other than {0001}), and having at least one of a substantially uniform distribution of the carrier concentration in the main surface, a substantially uniform distribution of the dislocation density in the main surface, and a small photoelasticity distortion in the main surface that is a distortion measured by photo elasticity, and relates to a method of manufacturing the GaN single crystal substrate. The invention also relates to a GaN-based semiconductor device including such a GaN single crystal substrate and at least one GaN-based semiconductor layer formed on the main surface of the substrate, and a method of manufacturing the GaN-based semiconductor device.

2. Description of the Background Art

Group III nitride crystals used suitably for light emitting devices, electronic devices, semiconductor sensors and the like are usually manufactured by means of vapor phase methods such as HVPE (hydride vapor phase epitaxy) and MOCVD (metal organic chemical vapor deposition), and liquid phase methods such as flux method, to grow a crystal on a main surface of a sapphire substrate where the main surface is a (0001) plane, or a main surface of a GaAs substrate where the main surface is a (111) A plane. Therefore, a group III nitride crystal as usually obtained has a main surface whose plane orientation is {0001}.

Regarding a light emitting device including a substrate of a group III nitride crystal having a main surface whose plane orientation is {0001}, and a light emitting layer of an MQW (multiple quantum well) structure on the main surface, the polarity in the <0001> direction of the group III nitride crystal causes spontaneous polarization in the light emitting layer, resulting in a large blue shift of light emission and a deteriorated luminous efficacy. A group III nitride crystal having a main surface whose plane orientation is other than {0001} is therefore needed.

In order to meet such a need, Japanese Patent Laying-Open No. 2008-143772 (Patent Document 1) discloses a method of manufacturing a group III nitride crystal having a main surface whose plane orientation has an off angle of 5° or less with respect to one of the plane orientations {1-10X} (where X is an integer of not less than 0), {11-2Y} (where Y is an integer of not less than 0}, and {HK-(H+K)0} (where H and K are each an integer other than 0), specifically a main surface whose plane orientation is one of {1-100}, {11-20}, {1-102}, {11-22}, {12-30}, and {23-50}.

Even if the manufacturing method disclosed in Japanese Patent Laying-Open No. 2008-143772 (Patent Document 1) is used, the group III nitride crystal grown on the main surface whose plane orientation is {1-100}, {11-20} or {23-50} is partially polycrystallized, resulting in a problem that a single crystal substrate of a large area is difficult to obtain. Further, at a crystal growth surface of the group III nitride crystal grown on the main surface having the plane orientation {1-102} or {11-22}, a facet with the plane orientation {0001} and a facet with a plane orientation other than {0001} are generated.

Here, the efficiency in taking in impurities from a facet of the plane orientation {0001} is considerably different from that from a facet of a plane orientation other than {0001}. A resultant problem is therefore a large variation of the carrier concentration and a large variation of the specific resistance in the main surface of the group III nitride crystal having been grown, and accordingly large variations of characteristics of a semiconductor device for which such a substrate is used.

Further, in a growth portion where a facet of the plane orientation of {0001} is a crystal growth surface, dislocation propagates perpendicularly to the {0001} plane (namely the <0001> direction). In a growth portion where a facet of a plane orientation other than {0001} is a crystal growth surface, dislocation propagates in parallel with the {0001} plane. A resultant problem is therefore a large variation of the dislocation density in the main surface of a grown group III nitride crystal, and thus large variations of characteristics of a semiconductor device using such a substrate.

Furthermore, because of a large variation of the dislocation density in the main surface of the grown group III nitride crystal, a group III nitride crystal substrate made from such a group III nitride crystal has a main surface in which a microscopic variation of distortion is generated, resulting in a problem that a large local distortion is generated.

Japanese Patent Laying-Open No. 2005-101475 (Patent Document 2) discloses a group III-V nitride based semiconductor substrate (specifically free-standing GaN substrate) having a substantially uniform distribution of the carrier concentration, and a method of manufacturing the semiconductor substrate. Although Japanese Patent Laying-Open No. 2005-101475 (Patent Document 2) discloses, regarding a group III-V nitride based semiconductor substrate having a main surface whose plane orientation is (0001), that crystal growth is made flat to provide a substantially uniform distribution of the carrier concentration, Patent Document 2 does not disclose or suggest that the distribution of the carrier concentration is made substantially flat for a group III-V nitride based semiconductor substrate having a main surface whose plane orientation is other than {0001}.

Further, Japanese Patent Laying-Open No. 2006-052102 (Patent Document 3) discloses a group III-V nitride based semiconductor substrate (specifically free-standing GaN substrate) having a substantially uniform distribution of the dislocation density, and a method of manufacturing the semiconductor substrate. Japanese Patent Laying-Open No. 2006-052102 (Patent Document 3) discloses, regarding a group III-V nitride based semiconductor substrate having a main surface whose plane orientation is (0001), that a crystal is grown while concaves are generated on a growth interface, the growth interface is flattened, and the crystal is further grown on the flattened growth interface, so that the dislocation density distribution is made substantially uniform. Patent Document 3, however, does not disclose or suggest that the dislocation density distribution is made substantially uniform for a group III-V nitride based semiconductor substrate having a main surface whose plane orientation is other than {0001}

Japanese Patent Laying-Open No. 2002-299741 (Patent Document 4) discloses a GaN single crystal substrate having a photoelasticity distortion value of not more than $5\times10^{-5}$ that is measured by photoelasticity in a main surface of the substrate. Japanese Patent Laying-Open No. 2002-299741 (Patent Document 4) merely discloses, regarding a GaN single crystal substrate having a main surface whose plane orientation is (0001), that a photoelasticity distortion value in the main surface is not more than $5\times10^{-5}$, and does not disclose or suggest, regarding a GaN single crystal substrate having a main surface whose plane orientation is other than (0001) and (000-1), the maximum value and a variation of the photoelasticity distortion value in the main surface.

SUMMARY OF THE INVENTION

An object of the present invention is to solve the above-described problems and provide a GaN single crystal substrate suitable for manufacture of a GaN-based semiconductor device having superior characteristics and a uniform distribution of characteristics, specifically a GaN single crystal substrate having a large area and a main surface whose plane orientation is other than (0001) and (000-1), and having at least one of a substantially uniform distribution of the carrier concentration in the main surface, a substantially uniform distribution of the dislocation density in the main surface, and a small photoelasticity distortion in the main surface that is a distortion measured by photoelasticity, and a method of manufacturing the GaN single crystal substrate. The present invention also has an object of providing a GaN-based semiconductor device having superior characteristics and a uniform distribution of characteristics, and including such a GaN single crystal substrate and at least one GaN-based semiconductor layer formed on the main surface of the substrate, and a method of manufacturing the GaN-based semiconductor device.

According to an aspect, the present invention is a GaN single crystal substrate having a main surface with an area of not less than 10 cm², the main surface having a plane orientation inclined by not less than 65° and not more than 85° with respect to one of a (0001) plane and a (000-1) plane, and the substrate has at least one of a substantially uniform distribution of a carrier concentration in the main surface, a substantially uniform distribution of a dislocation density in the main surface, and a photoelasticity distortion value of not more than $5\times10^{-5}$, the photoelasticity distortion value being measured by photoelasticity at an arbitrary point in the main surface when light is applied perpendicularly to the main surface at an ambient temperature of 25° C.

In the GaN single crystal substrate according to the above aspect of the present invention, a variation of the carrier concentration in the main surface may be within ±50% with respect to an average carrier concentration in the main surface. Further, a distribution of a specific resistance in the main surface may be substantially uniform. Here, a variation of the specific resistance in the main surface may be within ±50% with respect to an average specific resistance in the main surface. Further, an average specific resistance in the main surface may be not more than 0.1 Ωcm.

In the GaN single crystal substrate according to the above aspect of the present invention, a variation of the dislocation density in the main surface may be within ±100% with respect to an average dislocation density in the main surface. Further, the dislocation density in the main surface may be not more than $5\times10^6$ cm$^{-2}$.

In the GaN single crystal substrate according to the above aspect of the present invention, a variation of the photoelasticity distortion value in the main surface may be within ±100% with respect to an average value of the photoelasticity distortion value in the main surface.

In the GaN single crystal substrate according to the above aspect of the present invention, the plane orientation of the main surface may be inclined in <10-10> direction with respect to one of the (0001) plane and the (000-1) plane.

Further, a half width of an x-ray diffraction peak obtained by x-ray diffraction rocking curve measurement for one of a combination of (0002) and (20-20) planes and a combination of (0002) and (22-40) planes may be not more than 300 arc sec in a whole of the main surface.

According to another aspect, the present invention is a method of manufacturing a GaN single crystal substrate according to the above aspect, including the steps of: preparing a GaN seed crystal substrate having a main surface with an area of not less than 10 cm², the main surface having a plane orientation inclined by not less than 65° and not more than 85° with respect to one of a (0001) plane and a (000-1) plane; growing a GaN single crystal on the main surface of the GaN seed crystal substrate; and forming the GaN single crystal substrate by cutting the GaN single crystal along a plane that is parallel with the main surface of the GaN seed crystal substrate.

According to still another aspect, the present invention is a GaN-based semiconductor device including a GaN single crystal substrate according to the above aspect, and at least one GaN-based semiconductor layer formed on the main surface of the GaN single crystal substrate.

According to a further aspect, the present invention is a method of manufacturing a GaN-based semiconductor device including the steps of preparing a GaN single crystal substrate according to the above aspect; and growing at least one GaN-based semiconductor layer on the main surface of the GaN single crystal substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In crystallography, the plane orientation of a crystal plane is represented using notation such as (hkl) or (hkil) (Miller notation). The plane orientation of a crystal plane in a crystal of the hexagonal system such as group III nitride crystal that forms a GaN seed crystal substrate and a GaN single crystal substrate for example is represented by (hkil). Here, h, k, i, and l are each an integer called Miller index, and have a relation of $i=-(h+k)$. A plane having the plane orientation (hkil) is called (hkil) plane. The direction perpendicular to the (hkil) plane (normal to (hkil) plane) is called [hkil] direction. {hkil} represents a family of plane orientations including (hkil) and plane orientations crystallographically equivalent thereto, <hkil> represents a family of directions including [hkil] and directions crystallographically equivalent thereto.

Here, in a group III nitride crystal such as GaN seed crystal and GaN single crystal, group III element atom planes such as gallium (Ga) atom planes and nitrogen (N) atom planes are arranged alternately in the <0001> direction, and therefore, the crystal has a polarity in the <0001> direction. In the present invention, crystal axes are defined so that a group III element atom plane such as gallium atom plane is a (0001) plane, and a nitrogen atom plane is a (000-1) plane.

GaN Single Crystal Substrate

Embodiment 1

Figure 1:
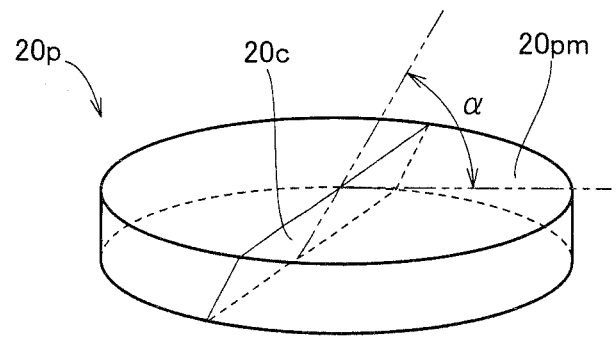
FIG. 1 is a schematic diagram showing an example of a GaN single crystal substrate according to an aspect of the present invention.
Figure 2:
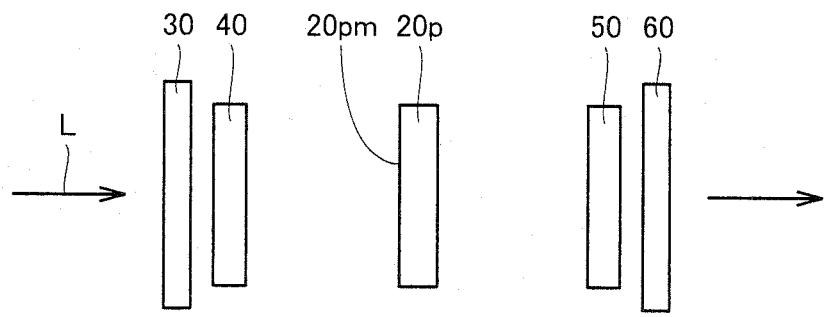
FIG. 2 is a schematic diagram showing an example of a method of measuring a photoelasticity distortion value of a GaN single crystal substrate according to an aspect of the present invention.

Referring to FIGS. 1 and 2, a GaN single crystal substrate 20p in an embodiment of the present invention includes a main surface 20pm having an area of not less than 10 cm². The plane orientation of main surface 20pm is inclined by not less than 65° and not more than 85° with respect to a plane 20c that is one of a (0001) plane and a (000-1) plane. The substrate has at least one of a substantially uniform distribution of the carrier concentration in main surface 20pm, a substantially uniform distribution of the dislocation density in main surface 20pm, and a photoelasticity distortion value of not more than $5\times10^{-5}$ where the photoelasticity distortion value is measured by photoelasticity at an arbitrary point in main surface 20pm when light L is applied perpendicularly to main surface 20pm at an ambient temperature of 25° C. GaN single crystal substrate 20p in the present embodiment is suitably used for manufacture of a GaN-based semiconductor device having superior characteristics and a uniform distribution of characteristics. A more specific description will be given below of GaN single crystal substrate 20p in the present embodiment.

Embodiment 1A

Referring to FIG. 1, as to GaN single crystal substrate 20p in the present embodiment, the area of main surface 20pm is not less than 10 cm², the plane orientation of main surface 20pm is inclined by not less than 65° and not more than 85° with respect to plane 20c that is one of a (0001) plane and a (000-1) plane, and the distribution of the carrier concentration in main surface 20pm is substantially uniform.

GaN single crystal substrate 20p in the present embodiment has a large area of main surface 20pm of 10 cm² or more. Further, the plane orientation of main surface 20pm is inclined by an inclination angle α of not less than 65° and not more than 85° with respect to plane 20c that is one of a (0001) plane and a (000-1) plane, and therefore, blue shift of light emission from a GaN-based semiconductor device using such a GaN single crystal substrate 20p is suppressed and degradation in luminous efficacy is thus suppressed. In view of this, the plane orientation of main surface 20pm is inclined preferably by inclination angle α of not less than 70° and not more than 80° with respect to plane 20c that is one of a (0001) plane and a (000-1) plane, and more preferably by inclination angle α of not less than 72° and not more than 78° with respect thereto. Further, the distribution of the carrier concentration in main surface 20pm is substantially uniform, and therefore, in a GaN-based semiconductor device using such a GaN single crystal substrate 20p, the distribution of device characteristics in a main surface of the device is substantially uniform.

Regarding GaN single crystal substrate 20p in the present embodiment, the fact that the distribution of the carrier concentration in main surface 20pm is substantially uniform means that the distribution of device characteristics in a main surface of a GaN-based semiconductor device using the GaN single crystal substrate is substantially uniform, and is represented for example by a variation within ±50% of the carrier concentration in main surface 20pm, with respect to an average carrier concentration in main surface 20pm. In order to further equalize the distribution of device characteristics in the main surface of the GaN-based semiconductor device, it is preferable that a variation of the carrier concentration in main surface 20pm is within ±30% with respect to the average carrier concentration in main surface 20pm. Here, the carrier concentration in main surface 20pm of GaN single crystal substrate 20p may be measured for example by the van der Pauw method along a two-dimensional direction and at a pitch of 2 mm in main surface 20pm.

For GaN single crystal substrate 20p in the present embodiment, in order to equalize the distribution of device characteristics, it is preferable that the distribution of the specific resistance in main surface 20pm is substantially uniform. Here, the fact that the distribution of the specific resistance in main surface 20pm of GaN single crystal substrate 20p is substantially uniform means that the distribution of device characteristics in a main surface of a GaN-based semiconductor device using the GaN single crystal substrate is substantially uniform, and is represented for example by a variation within ±50% of the specific resistance in main surface 20pm, with respect to an average specific resistance in the main surface. In order to further equalize the distribution of device characteristics in the main surface of the GaN-based semiconductor device, a variation of the specific resistance in main surface 20pm of GaN single crystal substrate 20p is preferably within ±30% with respect to the average specific resistance in main surface 20pm. Further, in order to enhance the electrical conductivity of the GaN-based semiconductor device, it is preferable that the average specific resistance in main surface 20pm of GaN single crystal substrate 20p is not more than 0.1 Ωcm. Here, the specific resistance in main surface 20pm of GaN single crystal substrate 20p may be measured for example by the van der Pauw method along a two-dimensional direction and at a pitch of 2 mm in main surface 20pm.

For GaN single crystal substrate 20p in the present embodiment, in order to achieve stable epitaxial growth of a GaN-based semiconductor layer of high crystallinity, it is preferable that the direction of inclination of the plane orientation of main surface 20pm with respect to plane 20c that is one of a (0001) plane and a (000-1) plane is the <10-10> direction. For a similar purpose, it is preferable that the half width of an x-ray diffraction peak obtained by x-ray diffraction rocking curve measurement for one of a combination of (0002) and (20-20) planes and a combination of (0002) and (22-40) planes is not more than 300 arc sec over the whole main surface 20pm. A smaller half width of the x-ray diffraction peak represents higher crystallinity.

For GaN single crystal substrate 20p where the plane orientation of main surface 20pm is {h0kl} (h, k and l are each an integer other than 0), diffraction crystal planes for the x-ray diffraction rocking curve measurement may be a (0002) plane and a (20-20) plane, or may be a (0002) plane and a (22-40) plane. Likewise, for GaN single crystal substrate 20p where the plane orientation of main surface 20pm is {hikl} (h, k, i, and l are each an integer other than 0), diffraction crystal planes for the x-ray diffraction rocking curve measurement may be a (0002) plane and a (20-20) plane, or may be a (0002) plane and a (22-40) plane. X-ray diffraction rocking curve measurement in the whole of main surface 20pm of GaN single crystal substrate 20p may be performed for example along a two-dimensional direction and at a pitch of 2 mm in main surface 20pm and with an x-ray irradiation area of 1 mm².

Embodiment 1B

Referring to FIG. 1, as to GaN single crystal substrate 20p in the present embodiment, the area of main surface 20pm is not less than 10 cm², the plane orientation of main surface 20pm is inclined by not less than 65° and not more than 85° with respect to plane 20c that is one of a (0001) plane and a (000-1) plane, and the distribution of the dislocation density in main surface 20pm is substantially uniform.

GaN single crystal substrate 20p in the present embodiment has a large area of main surface 20pm of 10 cm² or more. Further, the plane orientation of main surface 20pm is inclined by an inclination angle α of not less than 65° and not more than 85° with respect to plane 20c that is one of a (0001) plane and a (000-1) plane, and therefore, blue shift of light emission from a GaN-based semiconductor device using such a GaN single crystal substrate 20p is suppressed and degradation in luminous efficacy is thus suppressed. In view of this, the plane orientation of main surface 20pm is inclined preferably by inclination angle α of not less than 70° and not more than 80° with respect to plane 20c that is one of a (0001) plane and a (000-1) plane, and more preferably by inclination angle α of not less than 72° and not more than 78° with respect thereto. Further, the distribution of the dislocation density in main surface 20pm is substantially uniform, and therefore, in a GaN-based semiconductor device using such a GaN single crystal substrate 20p, the distribution of device characteristics in a main surface of the device is substantially uniform.

Regarding GaN single crystal substrate 20p in the present embodiment, the fact that the distribution of the dislocation density in main surface 20pm is substantially uniform means that the distribution of device characteristics in a main surface of a GaN-based semiconductor device using the GaN single crystal substrate is substantially uniform, and is represented for example by a variation within ±100% of the dislocation density in main surface 20pm of GaN single crystal substrate 20p, with respect to an average dislocation density in main surface 20pm. In order to further equalize the distribution of device characteristics in the main surface of the GaN-based semiconductor device, a variation of the dislocation density in main surface 20pm of GaN single crystal substrate 20p is preferably within −100% to +70% with respect to the average dislocation density in main surface 20pm, and more preferably within −100% to +50% with respect thereto. Here, the dislocation density in main surface 20pm of GaN single crystal substrate 20p may be measured for example by the CL (cathodoluminescence) method, along a two-dimensional direction and at a pitch of 2 mm in main surface 20pm, for a measurement area of 100 μm×100 nm.

For GaN single crystal substrate 20p in the present embodiment, in order to epitaxially grow a GaN-based semiconductor layer of high crystallinity, the dislocation density in main surface 20pm is preferably not more than $5 \times 10^6$ cm$^{-2}$ at a maximum dislocation density, and more preferably not more than $1 \times 10^{-6}$ cm$^{-2}$.

For GaN single crystal substrate 20p in the present embodiment, in order to achieve stable epitaxial growth of a GaN-based semiconductor layer of high crystallinity, it is preferable that the direction of inclination of the plane orientation of main surface 20pm with respect to plane 20c that is one of a (0001) plane and a (000-1) plane is the <10-10> direction. For a similar purpose, it is preferable that the half width of an x-ray diffraction peak obtained by x-ray diffraction rocking curve measurement for one of a combination of (0002) and (20-20) planes and a combination of (0002) and (22-40) planes is not more than 300 arc sec over the whole main surface 20pm. A smaller half width of the x-ray diffraction peak represents higher crystallinity.

For GaN single crystal substrate 20p where the plane orientation of main surface 20pm is {h0kl} (h, k and l are each an integer other than 0), diffraction crystal planes for the x-ray diffraction rocking curve measurement may be a (0002) plane and a (20-20) plane, or may be a (0002) plane and a (22-40) plane. Likewise, for GaN single crystal substrate 20p where the plane orientation of main surface 20pm is {hikl} (h, k, i, and l are each an integer other than 0), diffraction crystal planes for the x-ray diffraction rocking curve measurement may be a (0002) plane and a (20-20) plane, or may be a (0002) plane and a (22-40) plane. X-ray diffraction rocking curve measurement for the entire main surface 20pm of GaN single crystal substrate 20p may be performed for example along a two-dimensional direction and at a pitch of 2 mm in main surface 20pm and with an x-ray irradiation area of 1 mm².

Embodiment 1C

Referring to FIG. 1, as to GaN single crystal substrate 20p in an embodiment of the present invention, the area of main surface 20pm is not less than 10 cm², the plane orientation of main surface 20pm is inclined by not less than 65° and not more than 85° with respect to plane 20c that is one of a (0001)

plane and a (000-1) plane, and a photoelasticity distortion value is not more than $5 \times 10^{-5}$ where the photoelasticity distortion value is measured by photoelasticity at an arbitrary point in main surface 20pm when light is applied perpendicularly to main surface 20pm at an ambient temperature of 25° C.

GaN single crystal substrate 20p in the present embodiment has a large area of main surface 20pm of 10 cm$^2$ or more. Further, the plane orientation of main surface 20pm is inclined by an inclination angle α of not less than 65° and not more than 85° with respect to plane 20c that is one of a (0001) plane and a (000-1) plane, and therefore, blue shift of light emission from a GaN-based semiconductor device using such a GaN single crystal substrate 20p is suppressed and degradation in luminous efficacy is thus suppressed. In view of this, the plane orientation of main surface 20pm is inclined preferably by inclination angle α of not less than 70° and not more than 80° with respect to plane 20c that is one of a (0001) plane and a (000-1) plane, and more preferably by inclination angle α of not less than 72° and not more than 78° with respect thereto. Further, the photoelasticity distortion value is not more than $5 \times 10^{-5}$ that is measured by photoelasticity at an arbitrary point in main surface 20pm when light is applied perpendicularly to main surface 20pm at an ambient temperature of 25° C., and therefore, for a GaN-based semiconductor device using such a GaN single crystal substrate 20p, a large number of effects are expected including, for example, the effect that cracks are unlikely to be generated during production of the device, the effect that warp is reduced and the temperature uniformity is improved in epitaxial growth of a GaN-based semiconductor layer, the effect that the cleavage characteristic of the device is improved, and the effect that the polish quality of the substrate and the device is improved. In view of this, the photoelasticity distortion value is more preferably not more than $2 \times 10^{-5}$ and still more preferably not more than $1 \times 10^{-5}$.

Here, photoelasticity refers to the phenomenon that internal stress a of an elastic object causes different refractive indices of light, namely anisotropy of internal stress a causes birefringence to be generated in the object. It is supposed that there are three principal axes (x axis, y axis, z axis) for stress that are orthogonal to each other, and the axis of direction perpendicular to the main surface of the GaN single crystal substrate is the z axis. Referring to FIG. 2, light L of wavelength λ (monochromatic light of wavelength λ, or polychromatic or white light of peak wavelength λ) is applied, via a polarizer 30 and a λ/4 plate 40, perpendicularly to main surface 20pm of GaN single crystal substrate 20p of thickness t, and the light transmitted through the GaN single crystal substrate is observed via a λ/4 plate 50 and an analyzer 60. Then, two components of the polarized light that have different phases and are orthogonal to each other are observed. Here, the λ/4 plate is a device having a function of shifting (retarding for example) the phase of light having two components of perpendicular polarization planes.

Phase difference δ between the two polarized light components as observed is expressed by the following equation (1), with respective internal stresses $\sigma_x$ and $\sigma_y$ in the x-axis and z-axis directions, and respective changes $\Delta n_x$ and $\Delta n_y$ of the refractive index of the light components having polarization planes in these directions, using photoelasticity coefficient C that is a rate of change of the refractive index caused by a unit stress increase, light wavelength λ, and thickness t of the GaN single crystal substrate:

$$\delta = 2\pi t (\Delta n_x - \Delta n_y)/\lambda = 2\pi t C (\sigma_x - \sigma_y)/\lambda \quad (1)$$

where $\Delta n_x = C \sigma_x$ and $\Delta n_y = C \sigma_y$. Here, the photoelasticity distortion value is defined by $C (\sigma_x - \sigma_y)$ in equation (1). The polarization plane of the polarizer is made parallel with one of the x axis and the y axis that are principal axes of the internal stress, and the quantity of transmitted light when the polarization plane of the analyzer is made orthogonal to the polarization plane of the polarizer, and the quantity of transmitted light when the polarization plane of the analyzer is made parallel with the polarization plane of the polarizer are measured, phase difference δ is determined from a value representing the ratio between the measured quantities, and further, photoelasticity distortion value $C (\sigma_x - \sigma_y)$ is determined from equation (1). It should be noted that photoelasticity coefficient C is a constant determined depending on the type and structure of the crystal and the ambient temperature for measurement, and is the same value for the same crystal type, the same crystal structure and the same ambient temperature for measurement. Details of the method for determining photoelasticity distortion value $C (\sigma_x - \sigma_y)$ is disclosed in Japanese Patent Laying-Open No. 2002-299741.

For GaN single crystal substrate 20p in the present embodiment, in order to achieve stable epitaxial growth of a GaN-based semiconductor layer of high crystallinity, it is preferable that the direction of inclination of the plane orientation of main surface 20pm with respect to plane 20c that is one of a (0001) plane and a (000-1) plane is the <10-10> direction. For growth of a GaN-based semiconductor layer of high crystallinity, a variation of the photoelasticity distortion value in main surface 20pm is preferably within ±100% with respect to an average of the photoelasticity distortion value in main surface 20pm, and is more preferably −100% to +85% with respect thereto. Here, measurement of the photoelasticity distortion value at an arbitrary point in main surface 20pm of GaN single crystal substrate 20p may be done along a two-dimensional direction and at a pitch of 2 mm in main surface 20pm.

Method of Manufacturing GaN Single Crystal Substrate

Embodiment 2

Referring to FIGS. 3 to 6, a method of manufacturing a GaN single crystal substrate in another embodiment of the present invention is a method of manufacturing GaN single crystal substrate 20p in Embodiment 1, and includes the step of preparing a GaN seed crystal substrate 10p having a main surface 10pm with an area of not less than 10 cm$^2$, main surface 10pm having a plane orientation inclined by not less than 65° and not more than 85° with respect to plane 1c, 10c that is one of a (0001) plane and a (000-1) plane, the step of growing a GaN single crystal 20 on main surface 10pm of GaN seed crystal substrate 10p, and the step of forming GaN single crystal substrate 20p by cutting GaN single crystal 20 along a plane located parallel with main surface 10pm of GaN seed crystal substrate 10p. The method of manufacturing a GaN single crystal substrate in the present embodiment provides the GaN single crystal substrate suitably used for manufacture of a GaN-based semiconductor device having superior characteristics and a uniform distribution of characteristics. A more specific description will be given of a method of manufacturing a GaN single crystal substrate in Embodiments 1A, 1B, and 1C each.

Embodiment 2A

Figure 3:
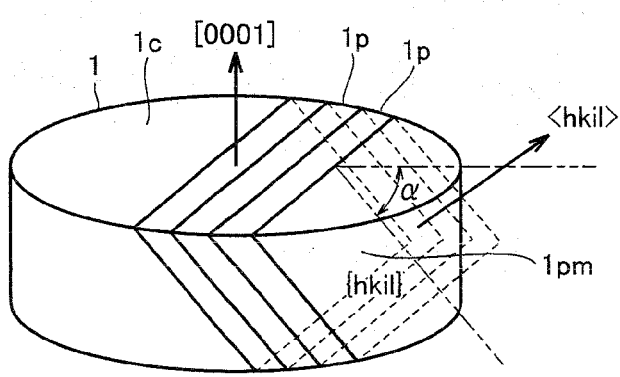
FIG. 3 is a schematic diagram showing an example of a method of manufacturing a GaN single crystal substrate according to another aspect of the present invention. Here, (A) and (B) illustrate the step of preparing a GaN seed crystal substrate that includes the sub step of cutting out a plurality of GaN mother crystal pieces from a GaN mother crystal, and the sub step of arranging a plurality of GaN mother crystal pieces adjacently to each other in the lateral direction, (C) illustrates the step of growing a GaN single crystal, and (D) illustrates the step of forming a GaN single crystal substrate.
Figure 3:
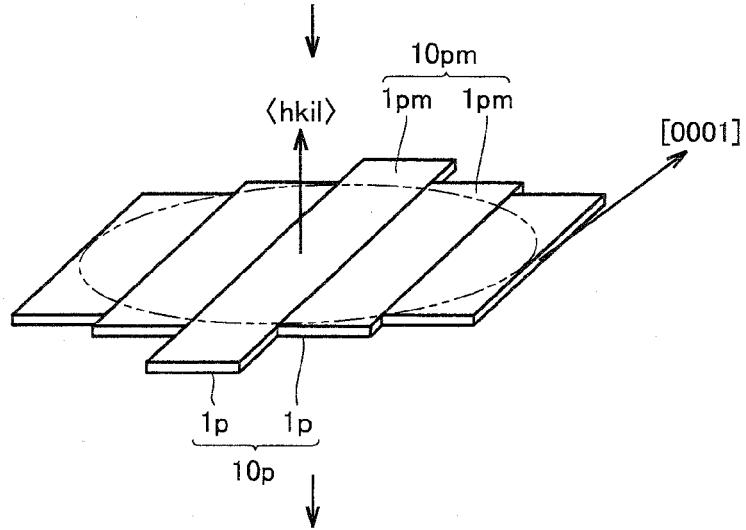
Figure 3:
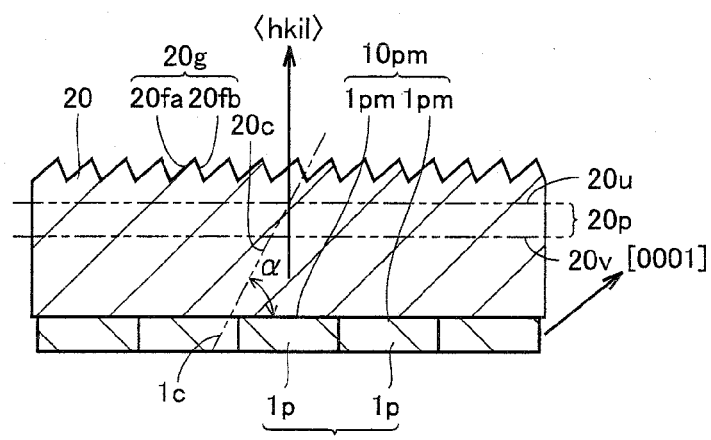
Figure 3:
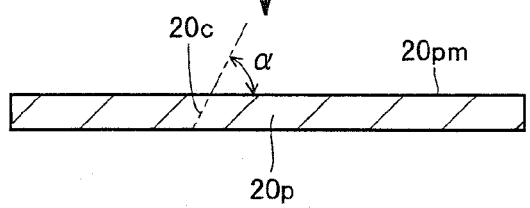
Figure 4:
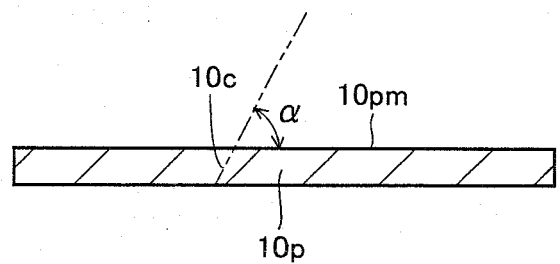
FIG. 4 is a schematic cross section showing another example of a method of manufacturing a GaN single crystal substrate according to another aspect of the present invention. Here, (A) illustrates the step of preparing a GaN seed crystal substrate, (B) illustrates the step of growing a GaN single crystal, and (C) illustrates the step of forming a GaN single crystal substrate.
Figure 4:
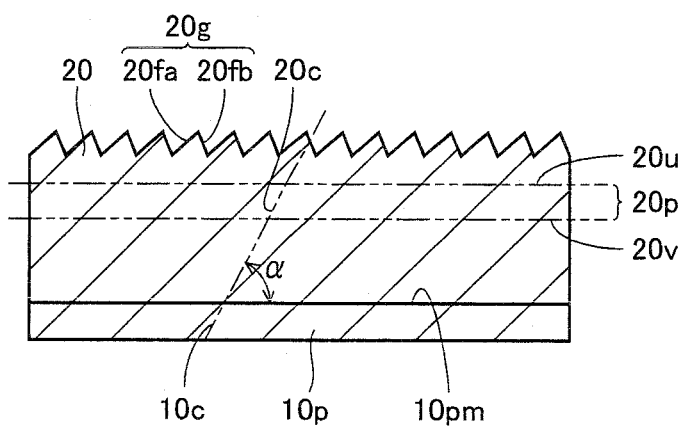
Figure 4:
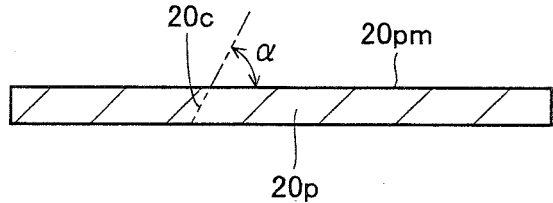

Referring to FIGS. 3 and 4, a method of manufacturing a GaN single crystal substrate in the present embodiment is a method of manufacturing GaN single crystal substrate 20p in Embodiment 1A, and includes the step of preparing GaN seed crystal substrate 10p having main surface 10pm with an area of not less than 10 cm², main surface 10pm having a plane orientation inclined by not less than 65° and not more than 85° with respect to plane 1c, 10c that is one of a (0001) plane and a (000-1) plane (FIG. 3 (A) to (B), FIG. 4 (A)), the step of growing GaN single crystal 20 on main surface 10pm of GaN seed crystal substrate 10p (FIG. 3 (C), FIG. 4 (B)), and the step of forming the GaN single crystal substrate by cutting GaN single crystal 20 along planes 20u, 20v that are parallel with main surface 10pm of GaN seed crystal substrate 10p (FIG. 3 (D), FIG. 4 (C)). The method of manufacturing a GaN single crystal substrate in the present embodiment includes the above-described steps so that the GaN single crystal substrate in Embodiment 1A can be manufactured efficiently.

Example I of Embodiment 2A

Referring to FIG. 3, an example of the method of manufacturing a GaN single crystal substrate in the present embodiment (hereinafter Example I) will be described.

Referring to FIGS. 3 (A) and (B), in Example I, the step of preparing GaN seed crystal substrate 10p includes the sub step of cutting out, from a GaN mother crystal 1, a plurality of GaN mother crystal pieces 1p each having a main surface 1pm with plane orientation inclined by inclination angle α of not less than 65° and not more than 85° with respect to plane 1c that is one of a (0001) plane and a (000-1) plane (FIG. 3 (A)), and the sub step of forming GaN seed crystal substrate 10p having main surface 10pm with an area of not less than 10 cm², main surface 10pm having a plane orientation inclined by an inclination angle α of not less than 65° and not more than 85° with respect to plane 1c that is one of a (0001) plane and a (000-1) plane, GaN seed crystal substrate 10p being formed by arranging a plurality of GaN mother crystal pieces 1p adjacently to each other in the lateral direction, so that respective main surfaces 1pm of the mother crystal pieces are parallel to each other and respective [0001] directions of the mother crystal pieces are parallel to each other (FIG. 3 (B)).

Referring first to FIG. 3 (A), in the sub step of cutting out a plurality of GaN mother crystal pieces 1p, a plurality of GaN mother crystal pieces 1p are cut out from GaN mother crystal 1 along a plane that is parallel with the plane orientation {hkil} inclined by inclination angle α of not less than 65° and not more than 85° with respect to plane 1c that is one of a (0001) plane and a (000-1) plane of GaN mother crystal 1 (along a plane perpendicular to the <hkil> direction). Here, inclination angle α can be measured by the x-ray diffractometry.

GaN mother crystal 1 used in the above step is not limited to a particular one, and may be any that is manufactured by a commonly used method, namely by any of vapor phase methods such as HVPE and MOCVD, and liquid phase methods such as flux method, to cause crystal growth on a main surface of a sapphire substrate having the main surface of a (0001) plane or GaAs substrate having the main surface of a (111) A plane, for example. Therefore, while GaN mother crystal 1 is not limited to a particular one, the mother crystal commonly has a main surface of a (0001) plane. In order to reduce the dislocation density and enhance the crystallinity, this GaN mother crystal 1 is preferably grown by the facet growth method having a feature that facets are formed at a surface where a crystal grows (crystal growth surface) and the crystal is grown without burying the facets, as disclosed in Japanese Patent Laying-Open No. 2001-102307.

The method of cutting out a plurality of GaN mother crystal pieces 1p from GaN mother crystal 1 is not limited to a particular one, and may use any of various means such as wire saw, inner peripheral blade, outer peripheral blade, or laser, for example.

In order to grow GaN single crystal 20 of high crystallinity, average roughness Ra of each of main surfaces 1pm and side surfaces of a plurality of GaN mother crystal pieces 1p is preferably not more than 50 nm and more preferably not more than 5 nm. Average roughness Ra of surfaces refers to arithmetic average roughness Ra defined by JIS B 0601: 2001, and specifically to a value determined by removing from a roughness curve a portion of a reference length along the direction in which an average line extends, calculating the sum of distances from the average line to the roughness curve in the removed portion (respective absolute values of the deviations), and dividing the sum by the reference length. Average roughness Ra of a surface can be measured by means of an AFM (atomic force microscope) or the like.

In order that average roughness Ra of each of main surfaces 1pm and side surfaces of a plurality of GaN mother crystal pieces 1p may be preferably not more than 50 nm and more preferably not more than 5 nm, it is preferable that a plurality of cut-out GaN mother crystal pieces 1p have respective main surfaces fpm and side surfaces that are ground and/or polished. Polishing includes mechanical polishing, CMP (chemical mechanical polishing) and the like.

Then, referring to FIG. 3 (B), in the sub step of forming GaN seed crystal substrate 10p, a plurality of cut-out GaN mother crystal pieces 1p are arranged adjacently to each other in the lateral direction so that respective main surfaces 1pm of the mother crystal pieces are parallel to each other and respective [0001] directions thereof are identical. Thus, GaN seed crystal substrate 10p is formed that has main surface 10pm with an area of not less than 10 cm² and with the plane orientation inclined by not less than 65° and not more than 85° with respect to plane 1c that is one of a (0001) plane and a (000-1) plane.

Regarding a plurality of GaN mother crystal pieces 1p, if respective angles formed between main surfaces 1pm and the crystal axis are not uniform in main surface 10pm of GaN seed crystal substrate 10p formed in the above-described manner, the chemical composition of the GaN single crystal grown on main surface 10pm of GaN seed crystal substrate 10p is not uniform within a plane that is parallel with main surface 10pm of GaN seed crystal substrate 10p. Therefore, a plurality of GaN mother crystal pieces 1p are arranged laterally so that respective main surfaces 1pm of these mother crystal pieces are parallel to each other. As long as respective main surfaces 1pm of these mother crystal pieces are parallel to each other, the main surfaces may not necessarily be on the same plane. Level difference ΔT (not shown) between respective main surfaces 1pm of two GaN mother crystal pieces 1p adjacent to each other, however, is preferably not more than 0.1 mm and more preferably not more than 0.01 mm.

Further, regarding a plurality of GaN mother crystal pieces 1p, in order to have the same crystal orientations of these mother crystal pieces and thereby achieve more uniform crystal growth, the GaN mother crystal pieces are arranged laterally so that respective [0001] directions of these mother crystal pieces are identical. A plurality of GaN mother crystal pieces 1p are also arranged adjacently to each other, because a gap between substrates, if any, deteriorates the crystallinity of a crystal grown on the gap.

Then, referring to FIG. 3 (C), in the step of growing GaN single crystal 20 on main surface 10pm of GaN seed crystal substrate 10p, the method of growing GaN single crystal 20 is not limited to a particular one. In order to epitaxially grow the GaN single crystal, preferably any of vapor phase methods such as HVPE and MOCVD and liquid phase methods such as flux method is used. Among the crystal growth methods, the HVPE method is preferable because it provides a high crystal growth rate.

When GaN single crystal 20 has been grown on main surface 10pm of GaN seed crystal substrate 10p, a crystal growth surface 20g of GaN single crystal 20 is macroscopically parallel with main surface 10pm of GaN seed crystal substrate 10p. Microscopically, however, a plurality of facets 20fa, 20fb that are not in parallel with main surface 10pm of GaN seed crystal substrate 10p are formed at crystal growth surface 20g. Such a plurality of facets 20fa, 20fb have respective plane orientations different from each other. Namely, GaN single crystal 20 is grown with crystal growth surface 20g including facet surfaces 20fa, 20fb having respective plane orientations different from each other. Here, since facet 20fa and facet 20fb are different in plane orientation, respective concentrations of impurities taken from these facets are different from each other. Therefore, in GaN single crystal 20 grown on main surface 10pm of GaN seed crystal substrate 10p, a variation in carrier concentration is generated in a plane that is parallel with main surface 10pm of GaN seed crystal substrate 10p.

At this time, if the inclination of the plane orientation of main surface 10pm of GaN seed crystal substrate 10p with respect to plane 1c that is one of a (0001) plane and a (000-1) plane is small, for example, if angle α of the inclination is smaller than 65°, crystal growth surface 20g of GaN single crystal 20 grown on this main surface 10pm is accordingly accompanied by facet 20fa having the plane orientation (0001) or (000-1) and facet 20fb having a plane orientation different from facet 20fa. Here, the concentration of impurities taken from facet 20fa with the plane orientation (0001) or (000-1) is significantly different from the concentration of impurities taken from facet 20fb with a plane orientation other than (0001) and (000-1). Therefore, in GaN single crystal 20 grown on main surface 10pm of GaN seed crystal substrate 10p where the inclination of the plane orientation of main surface 10pm is small with respect to plane 1c that is one of a (0001) plane and a (000-1) plane, the carrier concentration in a plane that is parallel with main surface 10pm of GaN seed crystal substrate 10p varies to a great extent.

In contrast, if the inclination of the plane orientation of main surface 10pm of GaN seed crystal substrate 10p with respect to plane 1c that is one of a (0001) plane and a (000-1) plane is large and close to the right angle, for example, if angle α of the inclination is larger than 85°, facets 20fb having the plane orientation perpendicular to (0001) are predominantly generated at crystal growth surface 20g of GaN single crystal 20 grown on main surface 10pm. Therefore, GaN single crystal 20 as grown is partially polycrystallized, resulting in a crack in GaN single crystal 20.

In view of the above, in order to manufacture GaN single crystal substrate 20p having a substantially uniform distribution of the carrier concentration in main surface 20pm, it is required that the plane orientation of main surface 10pm of GaN seed crystal substrate 10p has inclination angle α of not less than 65° and not more than 85° with respect to plane 1c that is one of a (0001) plane and a (000-1) plane, the inclination angle is preferably not less than 70° and not more than 80° and more preferably not less than 72° and not more than 78°.

Referring next to FIGS. 3 (C) and (D), in the step of forming GaN single crystal substrate 20p by cutting GaN single crystal 20 along planes 20u, 20v that are parallel with main surface 10pm of GaN seed crystal substrate 10p, the method of cutting out GaN single crystal substrate 20p from GaN single crystal 20 is not limited to a particular one, and may use any of various means such as wire saw, inner peripheral blade, outer peripheral blade, or laser, for example. Here, the plane along which GaN single crystal substrate 20p is cut out may be displaced from the position parallel with the main surface of GaN seed crystal substrate 10p as appropriate according to the purpose.

In order to grow a GaN-based semiconductor layer of high crystallinity, average roughness Ra of main surface 20pm of GaN single crystal substrate 20p is preferably not more than 50 nm and more preferably not more than 5 nm. The definition and the way to measure average roughness Ra of the surface are similar to the above-described ones. In order that average roughness Ra of main surface 20pm of GaN single crystal substrate 20p may be preferably not more than 50 nm and more preferably not more than 5 nm, it is preferable that cut-out GaN single crystal substrate 20p has main surface 20pm and side surface that are ground and/or polished. Polishing includes mechanical polishing, CMP (chemical mechanical polishing) and the like.

Through the above-described steps, GaN single crystal substrate 20p is obtained that has main surface 20pm with an area of not less than 10 cm$^2$ and with the plane orientation inclined by not less than 65° and not more than 85° with respect to plane 20c that is one of a (0001) plane and a (000-1) plane, and has a substantially uniform distribution of the carrier concentration in main surface 20pm (for example, a variation of the carrier concentration in main surface 20pm is within ±50% with respect to an average carrier concentration in this main surface 20pm).

Example II of Embodiment 2A

Referring to FIG. 4, another example of the method of manufacturing a GaN single crystal substrate in the present embodiment (hereinafter Example II) will be described.

With reference to FIG. 4 (A), in Example II, in the step of preparing GaN seed crystal substrate 10p, the GaN single crystal substrate manufactured in above-described Example I is prepared. Namely, as GaN seed crystal substrate 10p, the GaN single crystal substrate manufactured in above-described Example I is used. The GaN single crystal substrate manufactured in Example I above has a main surface with an area of not less than 10 cm$^2$ and with the plane orientation inclined by not less than 65° and not more than 85° with respect to plane 10c that is one of a (0001) plane and a (000-1) plane, and further has a uniform distribution of the carrier concentration in the main surface (for example, a variation of the carrier concentration in the main surface is within ±50% with respect to an average carrier concentration in this main surface). Thus, the GaN single crystal substrate in Embodiment 1A can be manufactured.

Next, referring to FIG. 4 (B), the step of growing GaN single crystal 20 on main surface 10pm of GaN seed crystal substrate 10p is similar to that in Example I above except that GaN seed crystal substrate 10p is formed of one GaN single crystal substrate instead of a plurality of GaN mother crystal pieces.

Next, referring to FIGS. 4 (B) and (C), the step of forming GaN single crystal substrate 20p by cutting GaN single crystal 20 along a plane located parallel with main surface 10pm of GaN seed crystal substrate 10p is similar to that in Example I above. Here, the plane along which GaN single crystal substrate 20p is cut out may be displaced from the position parallel with the main surface of GaN seed crystal substrate 10p as appropriate according to the purpose.

Through the above-described steps, GaN single crystal substrate 20p is obtained that has main surface 20pm with an area of not less than 10 cm² and with the plane orientation inclined by not less than 65° and not more than 85° with respect to plane 20c that is one of a (0001) plane and a (000-1) plane, and has a substantially uniform distribution of the carrier concentration in main surface 20pm (for example, a variation of the carrier concentration in main surface 20pm is within ±50% with respect to an average carrier concentration in this main surface 20pm).

If a substrate having a main surface with the plane orientation inclined by inclination angle α of not less than 65° and not more than 85° with respect to one of a (0001) plane and a (000-1) plane and with a large area of not less than 10 cm² can be cut out from a thick GaN mother crystal, the substrate may be used as the GaN seed crystal substrate. As for this method, however, it is very difficult and troublesome to produce a GaN seed crystal substrate of a large area. Therefore, like Example I in Embodiment 2A above, it is important to cut out a plurality of GaN mother crystal pieces from a single GaN mother crystal and arrange the plurality of GaN mother crystal pieces to form a GaN seed crystal substrate.

Embodiment 2B

Figure 5:
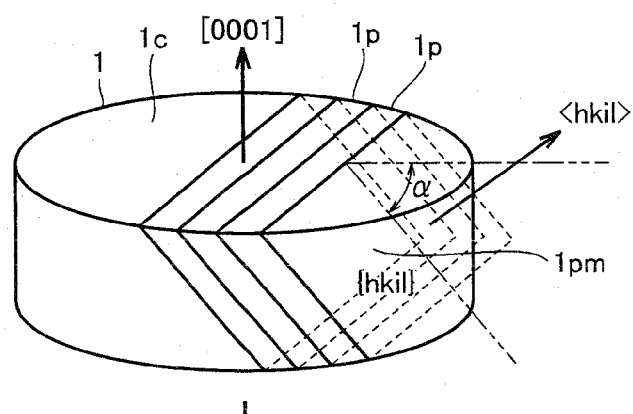
FIG. 5 is a schematic diagram showing an example of the step of preparing a GaN seed crystal substrate in a further example of a method of manufacturing a GaN single crystal substrate according to another aspect of the present invention. Here, (A) illustrates the sub step of cutting out a plurality of GaN mother crystal pieces from a GaN mother crystal, (B) illustrates the sub step of arranging a plurality of GaN mother crystal pieces adjacently to each other in the lateral direction, (C) illustrates the sub step of growing a GaN seed crystal, and (D) illustrates the sub step of forming a GaN seed crystal substrate.
Figure 5:
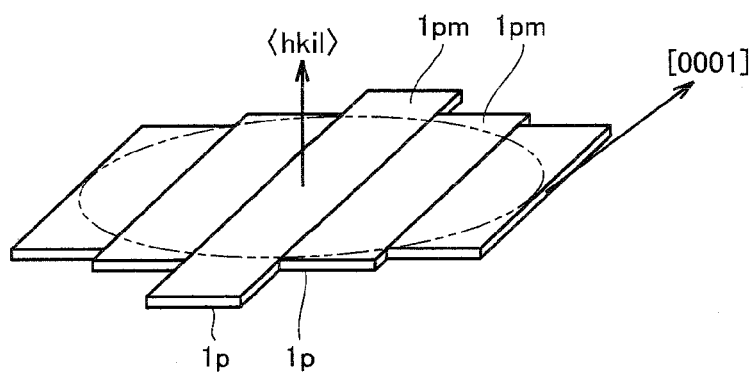
Figure 5:
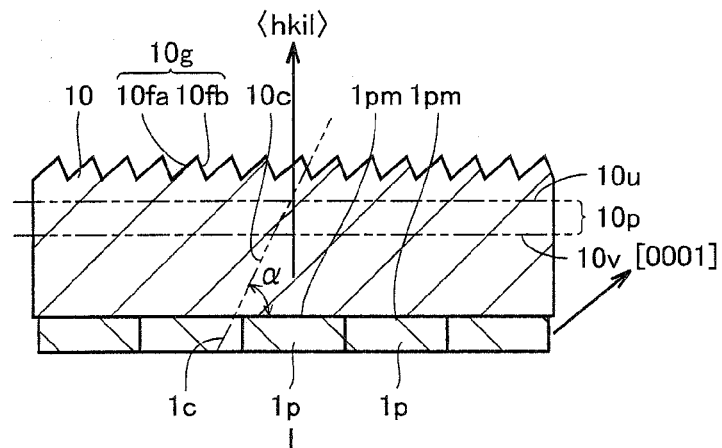
Figure 5:
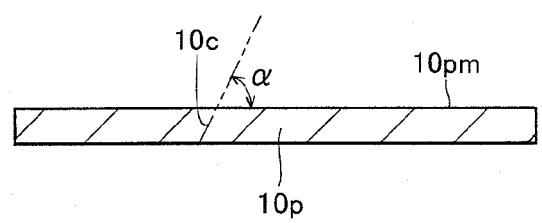
Figure 6:
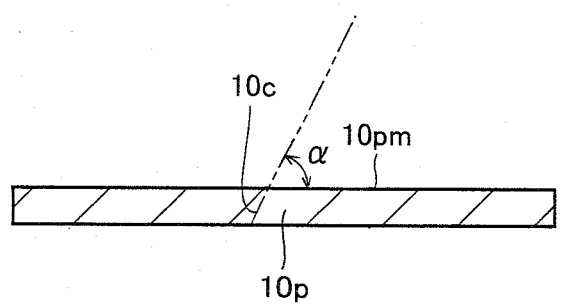
FIG. 6 is a schematic cross section showing a further example of a method of manufacturing a GaN single crystal substrate according to another aspect of the present invention. Here, (A) illustrates the step of preparing a GaN seed crystal substrate, (B) illustrates the step of growing a GaN single crystal, and (C) illustrates the step of forming a GaN single crystal substrate.
Figure 6:
Figure 6:
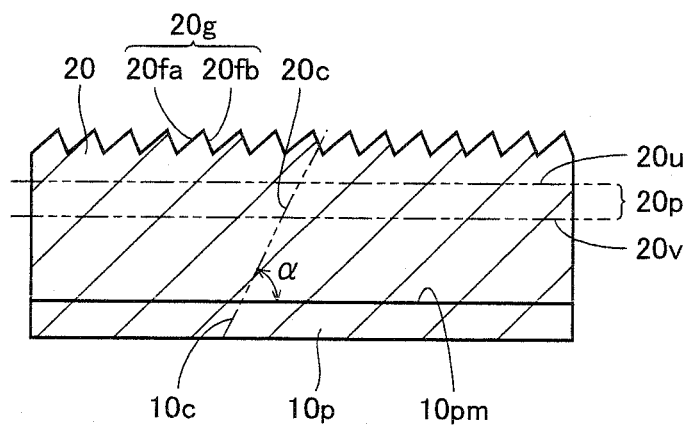
Figure 6:
Figure 6:
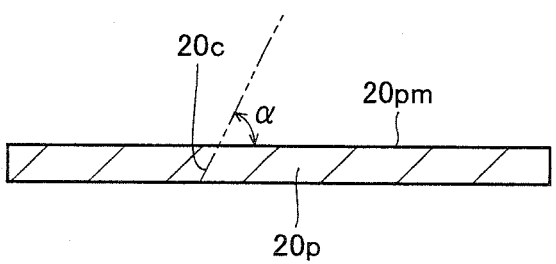

Referring to FIGS. 5 and 6, a method of manufacturing a GaN single crystal substrate in the present embodiment is a method of manufacturing GaN single crystal substrate 20p in Embodiment 1B or 1C, and includes the step of preparing GaN seed crystal substrate 10p having main surface 10pm with an area of not less than 10 cm², main surface 10pm having a plane orientation inclined by not less than 65° and not more than 85° with respect to plane 1c, 10c that is one of a (0001) plane and a (000-1) plane (FIG. 5 (A) to (D), FIG. 6 (A)), the step of growing GaN single crystal 20 on main surface 10pm of GaN seed crystal substrate 10p (FIG. 6 (B)), and the step of forming a GaN single crystal substrate 20p by cutting GaN single crystal 20 along planes 20u, 20v that are parallel with main surface 10pm of GaN seed crystal substrate 10p (FIG. 6 (C)). The method of manufacturing a GaN single crystal substrate in the present embodiment includes the above-described steps so that the GaN single crystal substrate in Embodiment 1B or 1C can be manufactured efficiently.

Step of Preparing GaN Seed Crystal Substrate:

Referring to FIG. 5, while the step of preparing a GaN seed crystal substrate in the present embodiment is not limited to a particular one, the step includes for example the sub step of cutting out a plurality of GaN mother crystal pieces from a GaN mother crystal (FIG. 5 (A)), the sub step of arranging a plurality of GaN mother crystal pieces adjacently to each other in the lateral direction (FIG. 5 (B)), the sub step of growing a GaN seed crystal on main surfaces of a plurality of GaN mother crystal pieces (FIG. 5 (C)), and the sub step of forming a GaN seed crystal substrate from the GaN seed crystal (FIG. 5 (D)).

First, referring to FIG. 5 (A), in the sub step of cutting out a plurality of GaN mother crystal pieces 1p, a plurality of GaN mother crystal pieces 1p are cut out from GaN mother crystal 1 along planes that are parallel with the plane orientation {hkil} inclined by inclination angle α of not less than 65° and not more than 85° with respect to plane 1c that is one of a (0001) plane and a (000-1) plane of GaN mother crystal 1 (along planes perpendicular to the <hkil> direction). With this sub step, a plurality of GaN mother crystal pieces 1p each having main surface 1pm with the plane orientation inclined by inclination angle α of not less than 65° and not more than 85° with respect to plane 1c that is one of a (0001) plane and a (000-1) plane is obtained. Here, inclination angle α can be measured by the x-ray diffractometry.

GaN mother crystal 1 used in the above sub step is not limited to a particular one, and may be any that is manufactured by a commonly used method, namely by any of vapor phase methods such as HVPE and MOCVD, and liquid phase methods such as flux method, to cause crystal growth on a main surface of a sapphire substrate having the main surface of the (0001) plane or GaAs substrate having the main surface of the (111) A plane, for example. Therefore, while GaN mother crystal 1 is not limited to a particular one, the mother crystal commonly has a main surface of the (0001) plane. In order to reduce the dislocation density and enhance the crystallinity, this GaN mother crystal 1 is preferably grown by the facet growth method having a feature that facets are formed at a surface where the crystal grows (crystal growth surface) and the crystal is grown without burying the facets, as disclosed in Japanese Patent Laying-Open No. 2001-102307.

The method of cutting out a plurality of GaN mother crystal pieces 1p from GaN mother crystal 1 is not limited to a particular one, and may use any of various means such as wire saw, inner peripheral blade, outer peripheral blade, or laser, for example.

In order to grow GaN seed crystal 10 of high crystallinity, average roughness Ra of each of main surfaces 1pm and side surfaces of a plurality of GaN mother crystal pieces 1p is preferably not more than 50 nm and more preferably not more than 5 nm. Average roughness Ra of surfaces refers to arithmetic average roughness Ra defined by JIS B 0601: 2001, and specifically to a value determined by removing from a roughness curve a portion of a reference length along the direction in which an average line extends, calculating the sum of distances from the average line to the roughness curve in the removed portion (respective absolute values of the deviations), and dividing the sum by the reference length. Average roughness Ra of surfaces can be measured by means of an AFM (atomic force microscope) or the like.

In order that average roughness Ra of each of main surfaces 1pm and side surfaces of a plurality of GaN mother crystal pieces 1p may be preferably not more than 50 nm and more preferably not more than 5 nm, it is preferable that a plurality of cut-out GaN mother crystal pieces 1p have respective main surfaces 1pm and side surfaces that are ground and/or polished. Polishing includes mechanical polishing, CMP (chemical mechanical polishing) and the like.

Then, referring to FIG. 5 (B), in the sub step of arranging a plurality of GaN mother crystal pieces adjacently to each other in the lateral direction, a plurality of cut-out GaN mother crystal pieces 1p are arranged adjacently to each other in the lateral direction so that respective main surfaces 1pm of the mother crystal pieces are parallel to each other and respective [0001] directions thereof are identical.

Regarding a plurality of GaN mother crystal pieces 1p, if respective angles formed between main surfaces 1pm and the crystal axis are not uniform in main surfaces 1pm of the mother crystal pieces, the chemical composition of a GaN seed crystal grown on main surfaces 1pm of the mother crystal pieces is not uniform within a plane that is parallel with main surfaces 1pm of the mother crystal pieces. Therefore, a plurality of GaN mother crystal pieces 1p are arranged laterally so that respective main surfaces 1pm of these mother crystal pieces are parallel to each other. As long as respective main surfaces 1pm of these mother crystal pieces are parallel to each other, the main surfaces may not necessarily be on the same plane. Level difference ΔT (not shown) between respective main surfaces 1pm of two GaN mother crystal pieces 1p adjacent to each other, however, is preferably not more than 0.1 mm and more preferably not more than 0.01 mm.

Further, regarding a plurality of GaN mother crystal pieces 1p, in order to have the same crystal orientations of these mother crystal pieces and thereby achieve more uniform crystal growth, the GaN mother crystal pieces are arranged laterally so that respective [0001] directions of these mother crystal pieces are identical. A plurality of GaN mother crystal pieces 1p are also arranged adjacently to each other, because a gap between substrates, if any, deteriorates the crystallinity of a crystal grown on the gap.

With the sub step above, a plurality of GaN mother crystal pieces 1p are obtained that are arranged adjacently to each other in the lateral direction so that respective main surfaces 1pm of a plurality of GaN mother crystal pieces 1p are parallel to each other and respective [0001] directions of the mother crystal pieces are identical, and main surface 1pm has the plane orientation inclined by not less than 65° and not more than 85° with respect to plane 1c that is one of a (0001) plane and a (000-1) plane.

Then, referring to FIG. 5 (C), in the step of growing GaN seed crystal 10 on main surfaces 1pm of a plurality of GaN mother crystal pieces 1p, the method of growing GaN seed crystal 10 is not limited to a particular one. In order to epitaxially grow the GaN seed crystal, preferably any of vapor phase methods such as HVPE and MOCVD and liquid phase methods such as flux method is used. Among the crystal growth methods, the HVPE method is preferable because it provides a high crystal growth rate.

When GaN seed crystal 10 has been grown on main surfaces 1pm of a plurality of GaN mother crystal pieces 1p, a crystal growth surface 10g of GaN seed crystal 10 is macroscopically parallel with main surfaces 1pm of a plurality of GaN mother crystal pieces 1p. Microscopically, however, a plurality of facets 10fa, 10fb that are not in parallel with main surfaces 1pm of a plurality of GaN mother crystal pieces 1p are formed. Such a plurality of facets 10fa, 10fb have respective plane orientations different from each other. Namely, GaN seed crystal 10 is grown with crystal growth surface 10g including a plurality of facets 10fa, 10fb having respective plane orientations different from each other.

Here, because facet 10fa and facet 10fb of crystal growth surface 10g have respective plane orientations different from each other, respective crystal-element sequences in facet 10fa and in facet 10fb are different from each other. Therefore, in a growth portion where facet 10fa is the crystal growth surface and in a growth portion where facet 10fb is the crystal growth surface, respective directions of dislocation propagation are different from each other.

Therefore, in GaN seed crystal 10 grown on main surfaces 1pm of a plurality of GaN mother crystal pieces 1p, a variation of the dislocation density is generated in a plane that is parallel with main surfaces 1pm of the mother crystal pieces, resulting in a microscopic variation of distortion in a plane that is parallel with main surfaces 1pm of the mother crystal pieces.

At this time, if the inclination of the plane orientation of main surfaces 1pm of a plurality of GaN mother crystal pieces 1p with respect to plane 1c that is one of a (0001) plane and a (000-1) plane is small, for example, if angle α of the inclination is smaller than 65°, crystal growth surface 10g of GaN seed crystal 10 grown on main surfaces 1pm is accordingly accompanied by facet 10fa having the plane orientation (0001) or (000-1) and facet 10fb having a plane orientation different from facet 10fa. Here, in a growth portion where facet 10fa having the plane orientation (0001) or (000-1) is the crystal growth surface, dislocation propagates in the direction perpendicular to (0001) or (000-1) (namely the <0001> direction). In a growth portion where facet 10fb having a plane orientation other than (0001) and (000-1) is the crystal growth surface, dislocation propagates in a direction inclined relative to the <0001> direction. Thus, in GaN seed crystal 10 grown on main surfaces 1pm and in main surface 10pm of GaN seed crystal substrate 10p obtained from the seed crystal, a large variation of the dislocation density is generated. Further, because of a microscopic variation of distortion in GaN seed crystal 10 and in main surface 10pm of GaN seed crystal substrate 10p obtained from the seed crystal, a large distortion is locally generated in a portion grown on such main surfaces 1pm. Accordingly, a semiconductor device using such a substrate has a large variation of device characteristics.

In contrast, if the inclination of the plane orientation of main surfaces 1pm of a plurality of GaN mother crystal pieces 1p with respect to plane 1c that is one of a (0001) plane and a (000-1) plane is large and close to the right angle, for example, if angle α of the inclination is larger than 85°, facets 10fb having the plane orientation perpendicular to (0001) are predominantly generated at crystal growth surface 10g of GaN seed crystal 10 grown on main surfaces 1pm. Therefore, GaN seed crystal 10 as grown is partially polycrystallized, resulting in a crack in GaN seed crystal 10.

In view of the above, in order to manufacture GaN seed crystal substrate 10p, it is required that the plane orientation of main surfaces 1pm of a plurality of GaN mother crystal pieces 1p has inclination angle α of not less than 65° and not more than 85° with respect to plane 1c that is one of a (0001) plane and a (000-1) plane, the inclination angle is preferably not less than 70° and not more than 80° and more preferably not less than 72° and not more than 78°.

Referring next to FIG. 5 (C) and (D), in the step of forming GaN seed crystal substrate 10p by cutting GaN seed crystal 10 along planes 10u, 10v that are parallel with main surfaces 1pm of a plurality of GaN mother crystal pieces 1p, the method of cutting out GaN seed crystal substrate 10p from GaN seed crystal 10 is not limited to a particular one, and may use any of various means such as wire saw, inner peripheral blade, outer peripheral blade, or laser, for example.

In order to grow a GaN single crystal of high crystallinity, average roughness Ra of main surface 10pm of GaN seed crystal substrate 10p is preferably not more than 50 nm and more preferably not more than 5 nm. The definition and the way to measure average roughness Ra of the surface are similar to the above-described ones. In order that average roughness Ra of main surface 10pm of GaN seed crystal substrate 10p may be preferably not more than 50 nm and more preferably not more than 5 nm, it is preferable that cut-out GaN seed crystal substrate 10p has main surface 10pm and side surface that are ground and/or polished. Polishing includes mechanical polishing, CMP (chemical mechanical polishing) and the like.

Through the above-described sub steps, referring to FIG. 5 (D) and FIG. 6 (A), GaN seed crystal substrate 10p is prepared that has main surface 10pm with an area of not less than 10 cm$^2$ and with the plane orientation inclined by not less than 65° and not more than 85° with respect to plane 10c that is one of a (0001) plane and a (000-1) plane.

In the case where a GaN mother crystal with a considerably large thickness is obtained, the above-described sub steps may be replaced with the following process. Namely, such a GaN mother crystal is cut along a plane that is parallel with the plane orientation <hkil> inclined by inclination angle α of not less than 65° and not more than 85° with respect to one of a (0001) plane and a (000-1) plane of the GaN mother crystal (along a plane perpendicular to the <hkil> direction), and the main surface is ground and/or polished, so that GaN seed crystal substrate 10p with main surface 10pm having an area of not less than 10 cm$^2$ and with the plane orientation inclined by not less than 65° and not more than 85° with respect to one of a (0001) plane and a (000-1) plane is prepared.

Step of Growing GaN Single Crystal:

Then, referring to FIG. 6 (B), in the step of growing GaN single crystal 20 on main surface 10pm of GaN seed crystal substrate 10p, the method of growing GaN single crystal 20 is not limited to a particular one. In order to epitaxially grow the GaN single crystal, preferably any of vapor phase methods such as HVPE and MOCVD and liquid phase methods such as flux method is used. Among the crystal growth methods, the HVPE method is preferable because it provides a high crystal growth rate.

When GaN single crystal 20 has been grown on main surface 10pm of GaN seed crystal substrate 10p, crystal growth surface 20g of GaN single crystal 20 is macroscopically parallel with main surface 10pm of GaN seed crystal substrate 10p. Microscopically, however, a plurality of facets 20fa, 20fb that are not in parallel with main surface 10pm of GaN seed crystal substrate 10p are formed. Such a plurality of facets 20fa, 20fb have respective plane orientations different from each other. Namely, GaN single crystal 20 is grown with crystal growth surface 20g including facet surfaces 20fa, 20fb having respective plane orientations different from each other.

Here, because facet 20fa and facet 20fb of crystal growth surface 20g have respective plane orientations different from each other, respective crystal-element sequences in facet 20fa and in facet 20fb are also different from each other. Therefore, in a growth portion where facet 20fa is the crystal growth surface and in a growth portion where facet 20fb is the crystal growth surface, respective directions of dislocation propagation are different from each other.

Therefore, in GaN single crystal 20 grown on main surface 10pm of GaN seed crystal substrate 10p, a variation of the dislocation density is generated in a plane that is parallel with main surface 10pm of GaN seed crystal substrate 10p. Further, in GaN single crystal 20 grown on main surface 10pm of GaN seed crystal substrate 10p, a microscopic variation of distortion is generated in a plane that is parallel with main surface 10pm of GaN seed crystal substrate 10p.

At this time, if the inclination of the plane orientation of main surface 10pm of GaN seed crystal substrate 10p with respect to plane 10c that is one of a (0001) plane and a (000-1) plane is small, for example, if angle α of the inclination is smaller than 65°, crystal growth surface 20g of GaN single crystal 20 grown on main surface 10pm is accordingly accompanied by facet 20fa having the plane orientation (0001) or (000-1) and facet 20fb having a plane orientation different from facet 20fa. Here, in a growth portion where facet 20fa having the plane orientation (0001) or (000-1) is the crystal growth surface, dislocation propagates in the direction perpendicular to (0001) or (000-1) (namely the <0001> direction). In a growth portion where facet 20fb having a plane orientation other than (0001) and (000-1) is the crystal growth surface, dislocation propagates in a direction inclined relative to the <0001> direction.

Thus, in GaN single crystal 20 grown on main surface 10pm and in main surface 20pm of GaN single crystal substrate 20p obtained from the single crystal, a large variation of the dislocation density is generated. Further, because of a microscopic variation of distortion in GaN single crystal 20 grown on main surface 10pm and in main surface 20pm of GaN single crystal substrate 20p obtained from the single crystal, a large distortion is locally generated. Accordingly, a semiconductor device using such a substrate has a large variation of device characteristics.

In contrast, if the inclination of the plane orientation of main surface 10pm of GaN seed crystal substrate 10p with respect to plane 10c that is one of a (0001) plane and a (000-1) plane is large and close to the right angle, for example, if angle α of the inclination is larger than 85°, facets 20fb having the plane orientation perpendicular to (0001) are predominantly generated at crystal growth surface 20g of GaN single crystal 20 grown on main surface 10pm. Therefore, GaN single crystal 20 as grown is partially polycrystallized, resulting in a crack in GaN single crystal 20.

In view of the above, in order to manufacture GaN single crystal substrate 20p having a substantially uniform distribution of the dislocation density in main surface 20pm, and in order to manufacture GaN single crystal substrate 20p having a photoelasticity distortion value of not more than 5×10$^{-5}$ in main surface 20pm, it is required that the plane orientation of main surface 10pm of GaN seed crystal substrate 10p has inclination angle α of not less than 65° and not more than 85° with respect to plane 10c that is one of a (0001) plane and a (000-1) plane, the inclination angle is preferably not less than 70° and not more than 80° and more preferably not less than 72° and not more than 78°.

Step of Forming GaN Single Crystal Substrate:

Referring next to FIG. 6 (B) and (C), in the step of forming GaN single crystal substrate 20p by cutting out GaN single crystal substrate 20p from GaN single crystal 20 along planes 20u, 20v that are parallel with main surface 10pm of GaN seed crystal substrate 10p, the method of cutting out GaN single crystal substrate 20p from GaN single crystal 20 is not limited to a particular one, and may use any of various means such as wire saw, inner peripheral blade, outer peripheral blade, or laser, for example.

In order to grow a GaN-based semiconductor layer of high crystallinity, average roughness Ra of main surface 20pm of GaN single crystal substrate 20p is preferably not more than 50 nm and more preferably not more than 5 nm. The definition and the way to measure average roughness Ra of the surface are similar to the above-described ones. In order that average roughness Ra of main surface 20pm of GaN single crystal substrate 20p may be preferably not more than 50 nm and more preferably not more than 5 nm, it is preferable that cut-out GaN single crystal substrate 20p has main surface 20pm and side surface that are ground and/or polished. Polishing includes mechanical polishing, CMP (chemical mechanical polishing) and the like.

Through the above-described steps, GaN single crystal substrate 20p is obtained that has main surface 20pm with an area of not less than 10 cm$^2$ and with the plane orientation inclined by not less than 65° and not more than 85° with respect to plane 20c that is one of a (0001) plane and a (000-1) plane, has a substantially uniform distribution of the dislocation density in main surface 20pm (for example, a variation of the dislocation density in main surface 20pm is within ±100% with respect to an average dislocation density in this main surface 20pm), and has a photoelasticity distortion value of not more than 5×10$^{-5}$ measured by photoelasticity at an arbitrary point in main surface 20pm when light is applied perpendicularly to main surface 20pm at an ambient temperature of 25° C.

GaN-Based Semiconductor Device

Embodiment 3

Figure 8:
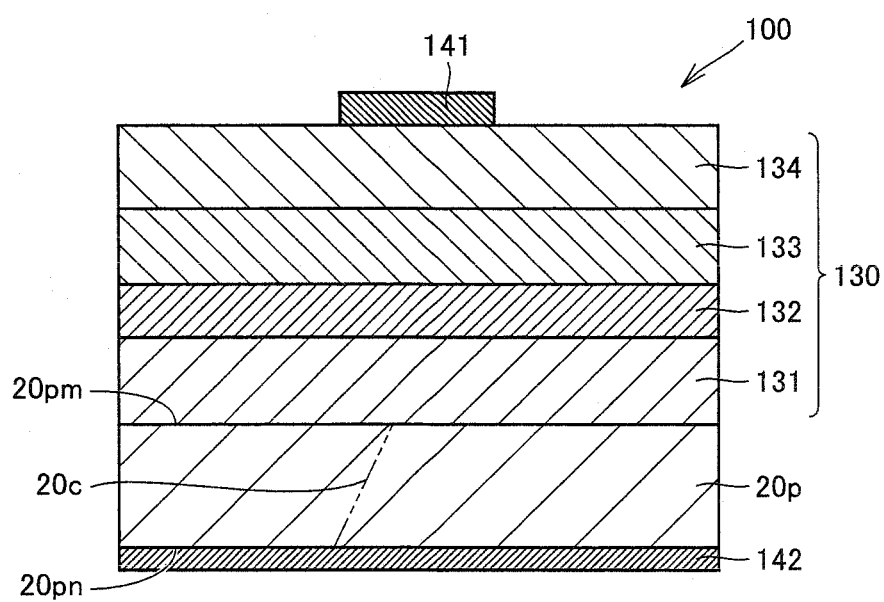
FIG. 8 is a schematic cross section showing an example of a GaN-based semiconductor device according to a further aspect of the present invention.

Referring to FIG. 8, a GaN-based semiconductor device 100 in a further embodiment of the present invention includes GaN single crystal substrate 20p in Embodiment 1, and at least one GaN-based semiconductor layer 130 formed on main surface 20pm of GaN single crystal substrate 20p.

In GaN-based semiconductor device 100 in the present embodiment, GaN single crystal substrate 20p has main surface 20pm with an area of not less than 10 cm², the plane orientation of main surface 20pm is inclined by not less than 65° and not more than 85° with respect to plane 20c that is one of a (0001) plane and a (000-1) plane, and GaN single crystal substrate 20p has at least one of a substantially uniform distribution of the carrier concentration in main surface 20pm (for example, a variation of the carrier concentration in main surface 20pm is within ±50% with respect to an average carrier concentration in this main surface 20pm), a substantially uniform distribution of the dislocation density in main surface 20pm (for example, a variation of the dislocation density in main surface 20pm is within ±100% with respect to an average dislocation density in this main surface 20pm), and a photoelasticity distortion value of not more than $5 \times 10^{-5}$ where the photoelasticity distortion value is measured by photoelasticity at an arbitrary point in main surface 20pm when light is applied perpendicularly to main surface 20pm at an ambient temperature of 25° C. Thus, the GaN-based semiconductor device in the present embodiment has a substantially uniform distribution of device characteristics in the main surface and has superior device characteristics. Regarding the device in the present embodiment, in the case for example where an electrode is formed on GaN single crystal substrate 20p in which the distribution of the carrier concentration in main surface 20pm is substantially uniform, the distribution of the contact resistance between the single crystal substrate and the electrode is substantially uniform.

Referring to FIG. 8, GaN-based semiconductor device 100 in the present embodiment includes, on one main surface 20pm of GaN single crystal substrate 20p of 50 mm in diameter×500 μm in thickness, at least one GaN-based semiconductor layer 130 is formed. This GaN-based semiconductor layer includes an Si-doped n-type GaN layer 131 having a thickness of 2 μm, a light emitting layer 132 having a multiple quantum well structure formed of six pairs of an $In_{0.01}Ga_{0.99}N$ barrier layer and an $In_{0.1}Ga_{0.9}N$ well layer and having a thickness of 100 nm, an Mg-doped p-type $Al_{0.18}Ga_{0.82}N$ layer 133 having a thickness of 20 nm, and an Mg-doped p-type GaN layer 134 having a thickness of 50 nm that are stacked in order. On a part of the surface of p-type GaN layer 134, an Ni/Au electrode of 0.2 mm×0.2 mm×0.5 μm in thickness that is a p-side electrode 141 is formed. Further, on another main surface 20pn of GaN single crystal substrate 20p, a Ti/Al electrode that is an n-side electrode 142 with a thickness of 1 μm is formed.

Method of Manufacturing GaN-Based Semiconductor Device

Embodiment 4

Referring to FIG. 8, a method of manufacturing GaN-based semiconductor device 100 in a further embodiment of the present invention includes the step of preparing GaN single crystal substrate 20p in Embodiment 1, and the step of growing at least one GaN-based semiconductor layer 130 on main surface 20pm of GaN single crystal substrate 20p.

According to the method of manufacturing GaN-based semiconductor device 100 in the present embodiment, at least one GaN-based semiconductor layer 130 is epitaxially grown on GaN single crystal substrate 20p. Main surface 20pm of GaN single crystal substrate 20p has an area of not less than 10 cm². The plane orientation of main surface 20pm is inclined by not less than 65° and not more than 85° with respect to plane 20c that is one of a (0001) plane and a (000-1) plane. GaN single crystal substrate 20p has at least one of a substantially uniform distribution of the carrier concentration in main surface 20pm (for example, a variation of the carrier concentration in main surface 20pm is within ±50% with respect to an average carrier concentration in this main surface 20pm), a substantially uniform distribution of the dislocation density in main surface 20pm (for example, a variation of the dislocation density in main surface 20pm is within ±100% with respect to an average dislocation density in this main surface 20pm), and a photoelasticity distortion value of not more than $5 \times 10^{-5}$ where the photoelasticity distortion value is measured by photoelasticity at an arbitrary point in main surface 20pm when light is applied perpendicularly to main surface 20pm at an ambient temperature of 25° C. Thus, the method of manufacturing a GaN-based semiconductor device in the present embodiment provides the GaN-based semiconductor device having a substantially uniform distribution of device characteristics in the main surface and having superior device characteristics. For example, when an electrode is formed on GaN single crystal substrate 20p having at least one of a substantially uniform distribution of the carrier concentration in main surface 20pm, a substantially uniform distribution of the dislocation density in main surface 20pm, and a photoelasticity distortion value of not more than $5 \times 10^{-5}$ where the photoelasticity distortion value is measured by photoelasticity at an arbitrary point in main surface 20pm when light is applied perpendicularly to main surface 20pm at an ambient temperature of 25° C., the distribution of the contact resistance between the single crystal substrate and the electrode is substantially uniform.

The step of preparing GaN single crystal substrate 20p in Embodiment 1 is performed following the method of manufacturing GaN single crystal substrate 20p in Embodiment 2 above, for example. Here, GaN single crystal substrate 20p in Embodiment 1 has main surface 20pm with an area of not less than 10 cm² and with the plane orientation inclined by not less than 65° and not more than 85° with respect to plane 20c that is one of a (0001) plane and a (000-1) plane, and has at least one of a substantially uniform distribution of the carrier concentration in main surface 20pm (for example, a variation of the carrier concentration in main surface 20pm is within ±50% with respect to an average carrier concentration in this main surface 20pm), a substantially uniform distribution of the dislocation density in main surface 20pm (for example, a variation of the dislocation density in main surface 20pm is within ±100% with respect to an average dislocation density in this main surface 20pm), and a photoelasticity distortion value of not more than $5 \times 10^{-5}$ where the photoelasticity distortion value is measured by photoelasticity at an arbitrary point in main surface 20pm when light is applied perpendicularly to main surface 20pm at an ambient temperature of 25° C.

The method of growing at least one GaN-based semiconductor layer 130 on main surface 20pm of GaN single crystal substrate 20p is not limited to a particular one. For the sake of epitaxial growth of GaN-based semiconductor layer 130 of high crystallinity, HVPE, MOCVD, MBE (Molecular Beam Epitaxy) or the like is preferably used. For the sake of high productivity and high reliability, MOCVD is more preferably used.

Referring to FIG. 8, in the step of forming at least one GaN-based semiconductor layer 130 on GaN single crystal substrate 20p, MOCVD is used to grow at least one GaN-based semiconductor layer 130 on one main surface 20pm of GaN single crystal substrate 20p of 50 mm in diameter×0.4 mm in thickness, for example. Specifically, Si-doped n-type GaN layer 131 having a thickness of 2 μm, light emitting layer 132 having a multiple quantum well structure formed of six pairs of an $In_{0.01}Ga_{0.99}N$ barrier layer and an $In_{0.1}Ga_{0.9}N$ well layer and having a thickness of 100 nm, Mg-doped p-type $Al_{0.18}Ga_{0.82}N$ layer 133 having a thickness of 20 nm, and Mg-doped p-type GaN layer 134 having a thickness of 50 nm are grown in order.

Further, on a part of the surface of p-type GaN layer 134, the Ni/Au electrode of 0.5 μm in thickness is formed as p-side electrode 141 by means of the vacuum deposition method. Further, on the other main surface 20pn of GaN single crystal substrate 20p, the Ti/Al electrode of 1pm in thickness is formed as n-side electrode 142 by means of the vacuum deposition method.

Next, a wafer including at least one GaN-based semiconductor layer 130 formed on GaN single crystal substrate 20p is divided into chips of a predetermined size so that a light emitting device of a predetermined size is obtained.

EXAMPLES

Production of GaN Mother Crystal A

GaN mother crystal A was produced in the following manner. On a main surface of a (111) A plane of a GaAs substrate (base substrate) having a diameter of 50 mm and a thickness of 0.8 mm, an SiO layer (mask layer) was formed which had a thickness of 100 nm and in which a plurality of openings of 2 μm in diameter were arranged two-dimensionally in the hexagonal close-packed manner at a pitch of 4 μm, by photolithography and etching. Next, on the main surface of the GaAs substrate on which the SiO layer with a plurality of openings was formed, the HVPE method was performed to grow a GaN low-temperature layer of 80 nm in thickness at 500° C. Then, a GaN intermediate layer of 60 μm in thickness was grown at 950° C. After this, at 1050° C., GaN mother crystal A of 5 mm in thickness was grown. Next, by means of etching with aqua regia, the GaAs substrate was removed from GaN mother crystal A to obtain GaN mother crystal A having a diameter of 50 mm and a thickness of 3 mm.

Example A1

1. Preparation of GaN Seed Crystal Substrate

Referring to FIG. 3 (A), a (0001) plane and (000-1) plane 1c that are respectively the two main surfaces of GaN mother crystal A (GaN mother crystal 1) were ground and polished so that average roughness Ra of the two main surfaces was 5 nm. Here, average roughness Ra of the surfaces was measured by means of AFM.

Next, referring to FIG. 3 (A), GaN mother crystal 1 having average roughness Ra of 5 nm of the two main surfaces was sliced along a plane that is parallel with the {20-21} plane (along a plane perpendicular to the <20-21> direction), so that a plurality of GaN mother crystal pieces 1p having a main surface of {20-21} were cut out. Subsequently, the four unground and un-polished sides of the cut-out GaN mother crystal pieces 1p each were ground and polished, so that average roughness Ra of these four sides was 5 nm. In this way, a plurality of GaN mother crystal pieces 1p having average roughness Ra of 5 nm of the main surface of {20-21} were obtained. These GaN mother crystal pieces 1p included a crystal piece having its main surface whose plane orientation is not exactly identical to {20-21}. Regarding any of the crystal pieces, however, the plane orientation of the main surface had an inclination angle within ±0.1° with respect to {20-21}. Here, the inclination angle was measured by the x-ray diffractometry.

Next, referring to FIG. 3 (B), a plurality of GaN mother crystal pieces 1p were arranged adjacently to each other in the lateral direction, in such a manner that respective main surfaces 1pm of {20-21} of a plurality of GaN mother crystal pieces 1p were parallel to each other and respective [0001] directions of these GaN mother crystal pieces 1p were identical. Further, the outer peripheral portion was partially removed. In this way, GaN seed crystal substrate 10p of 50 mm in diameter was prepared.

2. Growth of GaN Single Crystal

Next, referring to FIG. 3 (C), main surface 10pm of {20-21} of GaN seed crystal substrate 10p as described above was processed in a gas mixture atmosphere of 10 vol % of hydrogen chloride gas and 90 vol % of nitrogen gas and at 800° C. for two hours. After this, on this main surface 10pm, the HVPE method was performed to grow GaN single crystal 20 at a crystal growth temperature of 1050° C. and at a growth rate of 80 μm/hr four 50 hours.

3. Formation of GaN Single Crystal Substrate

Figure 7:
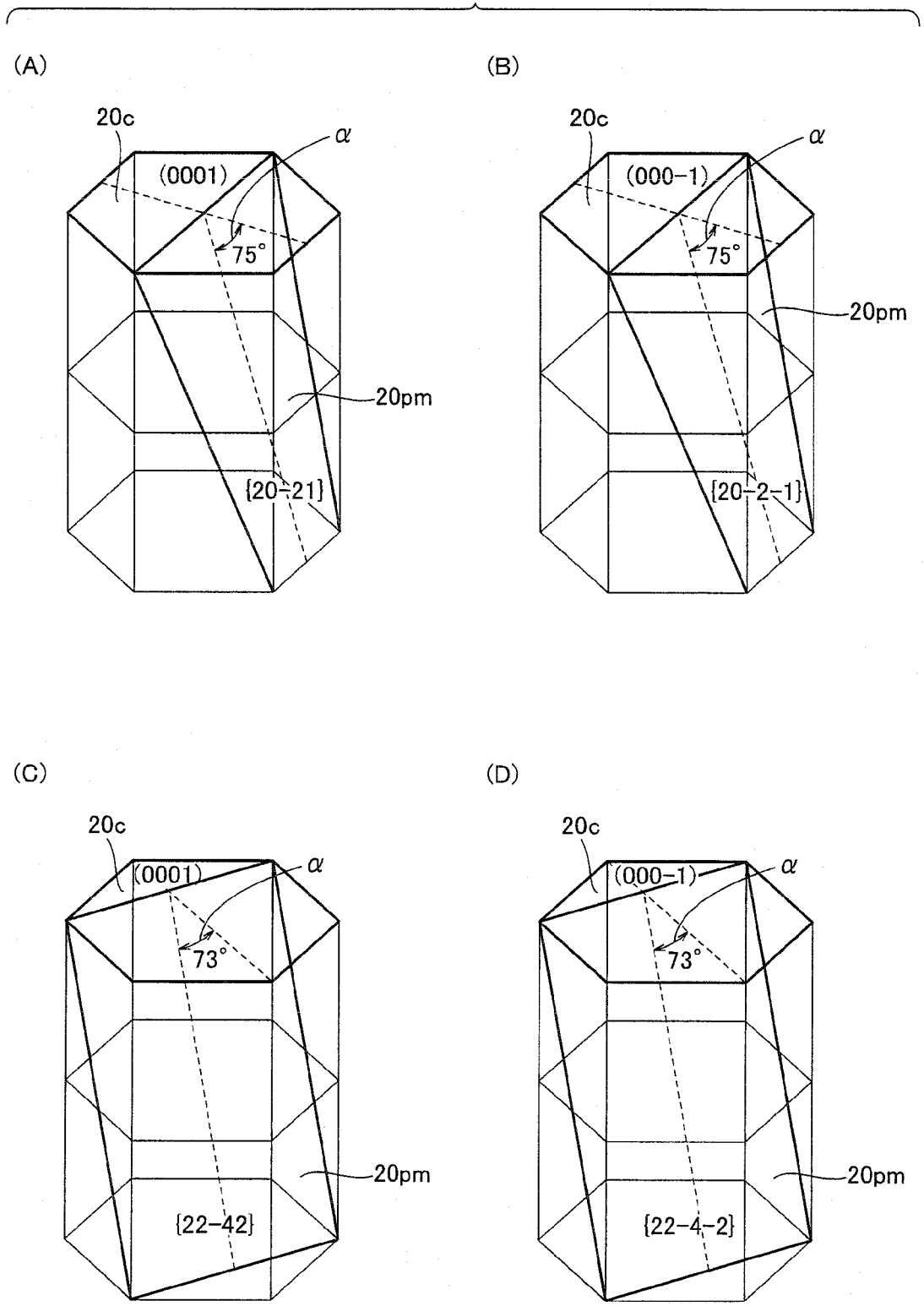
FIG. 7 is a schematic diagram showing a state of inclination of a plane orientation of a main surface with respect to one of a (0001) plane and a (000-1) plane in a GaN single crystal substrate according to an aspect of the present invention. Here, (A) illustrates where the plane orientation of the main surface is {20-21}, (B) illustrates where the plane orientation of the main surface is {20-2-1}, (C) illustrates where the plane orientation of the main surface is {22-42}, and (D) illustrates where the plane orientation of the main surface is {22-4-2}.

Next, referring to FIG. 3 (D), above-described GaN single crystal 20 was sliced along planes 20u, 20v that are parallel with main surface 10pm of {20-21} of GaN seed crystal substrate 10p to obtain GaN single crystal substrate 20p having main surface 20pm whose plane orientation is {20-21}, and having a diameter of 50 mm and a thickness of 0.5 mm. For GaN single crystal substrate 20p, main surface 20pm was further ground and polished so that average roughness Ra of main surface 20pm was 5 nm. Referring to FIG. 7 (A), main surface 20pm of {20-21} of GaN single crystal substrate 20p has inclination angle α of 75° with respect to (0001) plane 20c.

The carrier concentration in main surface 20pm of GaN single crystal substrate 20p formed in the above-described manner was measured by means of the van der Pauw method at 400 measurement points from the center toward the outer periphery in main surface 20pm, at a pitch of 2 mm along each of two directions orthogonal to each other, except for measurement points in the peripheral portion. The average carrier concentration was $5.7 \times 10^{17}$ cm$^{-3}$, the minimum carrier concentration was $3.9 \times 10^{17}$ cm$^{-3}$, and the maximum carrier concentration was $7.2 \times 10^{17}$ cm$^3$. Therefore, the variation of the carrier concentration relative to the average carrier concentration in the main surface was a small variation of −31.6% to +26.3%.

Further, the specific resistance in main surface 20pm of GaN single crystal substrate 20p was measured by means of the van der Pauw method at 400 measurement points from the center toward the outer periphery in main surface 20pm, at a pitch of 2 mm along each of two directions orthogonal to each other, except for measurement points in the peripheral portion. The average specific resistance was 0.019 Ω·cm, the minimum specific resistance was 0.014 Ω·cm, and the maximum specific resistance was 0.026 Ω·cm. Therefore, the variation of the specific resistance relative to the average specific resistance in the main surface was a small variation of −26% to +37%.

4. Manufacture of GaN-Based Semiconductor Device

Referring next to FIG. 8, on one main surface 20pm of GaN single crystal substrate 20p (50 mm in diameter×0.4 mm in thickness), the MOCVD method was performed to grow at least one GaN-based semiconductor layer 130. Specifically, Si-doped n-type GaN layer 131 having a thickness of 2 μm (average carrier concentration: $2 \times 10^{18}$ cm$^{-3}$), light emitting layer 132 having a multiple quantum well structure formed of six pairs of an $In_{0.01}Ga_{0.99}N$ barrier layer and an $In_{0.1}Ga_{0.9}N$ well layer and having a thickness of 100 nm, Mg-doped p-type $Al_{0.18}Ga_{0.82}N$ layer 133 having a thickness of 20 nm (average carrier concentration: $3\times10^{17}$ cm$^{-3}$), and Mg-doped p-type GaN layer 134 having a thickness of 50 nm (average carrier concentration: $1\times10^{18}$ cm$^{-3}$) were grown in order.

Next, by the vacuum deposition method, Ni/Au electrodes of 0.2 mm×0.2 mm×0.5 μm in thickness were formed as p-side electrodes 141 at a pitch of 1 mm along two directions orthogonal to each other on p-type GaN layer 134. Further, by the vacuum deposition method, a Ti/Al electrode of 1 μm in thickness was formed as n-side electrode 142 on the other main surface 20pn of GaN single crystal substrate 20p.

Then, a wafer including above-described at least one GaN-based semiconductor layer 130 formed on GaN single crystal substrate 20p was divided into a plurality of chips of 1 mm×1 mm, namely GaN-based semiconductor devices (chips were generated from the wafer), so that each p-side electrode is located at a center of each chip, except for an outer peripheral portion in the wafer, for which the distribution of the carrier concentration and the specific resistance was not measured, in main surface 20pm of GaN single crystal substrate 20p. GaN-based semiconductor device 100 obtained in this manner was an LED (light emitting diode) having an emission peak wavelength of 450 nm.

The brightness of the main surface of the LED (GaN-based semiconductor device 100) manufactured in the above-described manner was measured by means of a brightness measurement integrating sphere, for 1600 LEDs in the form of chips as described above. The average brightness of LEDs obtained in the present Example A1 was used as an average relative brightness of 1.0, and the average relative brightness as well as the sample variance of the relative brightness were expressed for each of Examples A1 to A4 and Comparative Examples RA3, RA4. The LEDs manufactured in this Example A1 had a large average relative brightness of 1.0, and a small sample variance of the relative brightness of 0.12. The results are summarized in Table 1.

Example A2

Referring to FIG. 3 (A) to (D), GaN single crystal substrate 20p having main surface 20pm with the plane orientation of {20-2-1} was formed similarly to Example A1 except that, in the step of preparing GaN seed crystal substrate 10p, GaN mother crystal A (GaN mother crystal 1) having average roughness Ra of 5 nm of the two main surfaces was sliced along a plane that is parallel with the {20-2-1} plane (along a plane perpendicular to the <20-2-1> direction) so as to cut out a plurality of GaN mother crystal pieces 1p each having a main surface of {20-2-1}, the main surfaces of the crystal pieces were ground and polished, and resultant GaN mother crystal pieces 1p having average roughness Ra of 5 nm of respective main surfaces were used. Referring to FIG. 7 (B), main surface 20pm of {20-2-1} of GaN single crystal substrate 20p has inclination angle α of 75° relative to (000-1) plane 20c.

As to the carrier concentration in main surface 20pm of GaN single crystal substrate 20p formed in the above-described manner, the average carrier concentration was $7.1\times10^{17}$ cm$^{-3}$, the minimum carrier concentration was $5.0\times10^{17}$ cm$^{-3}$, and the maximum carrier concentration was $8.2\times10^{17}$ cm$^{-3}$. Therefore, the variation of the carrier concentration relative to the average carrier concentration in the main surface was a small variation of −29.6% to +15.5%. As to the specific resistance in main surface 20pm of GaN single crystal substrate 20p, the average specific resistance was 0.016 Ω·cm, the minimum specific resistance was 0.012 Ω·cm, and the maximum specific resistance was 0.020 Ω·cm. Therefore, the variation of the specific resistance relative to the average specific resistance in the main surface was a small variation of −25% to +25%.

Further, this GaN single crystal substrate 20p was used to manufacture LEDs that are each a GaN-based semiconductor device, similarly to Example A1. As to the brightness of the main surfaces of the manufactured LEDs (GaN-based semiconductor devices 100), the LEDs had a large average relative brightness of 1.2 and a small sample variance of the relative brightness of 0.11. The results are summarized in Table 1.

Example A3

Referring to FIG. 3 (A) to (D), GaN single crystal substrate 20p having main surface 20pm with the plane orientation of {22-42} was formed similarly to Example A1 except that, in the step of preparing GaN seed crystal substrate 10p, GaN mother crystal A (GaN mother crystal 1) having average roughness Ra of 5 nm of the two main surfaces was sliced along a plane that is parallel with the {22-42} plane (along a plane perpendicular to the <22-42> direction) so as to cut out a plurality of GaN mother crystal pieces 1p each having a main surface of {22-42}, the main surfaces of the crystal pieces were ground and polished, and resultant GaN mother crystal pieces 1p having average roughness Ra of 5 nm of respective main surfaces were used. Referring to FIG. 7 (C), main surface 20pm of {22-42} of GaN single crystal substrate 20p has inclination angle α of 73° relative to (0001) plane 20c.

As to the carrier concentration in main surface 20pm of GaN single crystal substrate 20p formed in the above-described manner, the average carrier concentration was $6.1\times10^{17}$ cm$^{-3}$, the minimum carrier concentration was $3.5\times10^{17}$ cm$^{-3}$, and the maximum carrier concentration was $8.7\times10^{17}$ cm$^{-3}$. Therefore, the variation of the carrier concentration relative to the average carrier concentration in the main surface was a small variation of −42.6% to +42.6%. As to the specific resistance in main surface 20pm of GaN single crystal substrate 20p, the average specific resistance was 0.020 Ω·cm, the minimum specific resistance was 0.012 Ω·cm, and the maximum specific resistance was 0.029 Ω·cm. Therefore, the variation of the specific resistance relative to the average specific resistance in the main surface was a small variation of −40% to +45%.

Further, this GaN single crystal substrate 20p was used to manufacture LEDs that are each a GaN-based semiconductor device, similarly to Example A1. As to the brightness of the main surfaces of the manufactured LEDs (GaN-based semiconductor devices 100), the LEDs had a large average relative brightness of 0.9 and a small sample variance of the relative brightness of 0.14. The results are summarized in Table 1.

Example A4

Referring to FIG. 3 (A) to (D), GaN single crystal substrate 20p having main surface 20pm with the plane orientation of {22-4-2} was formed similarly to Example A1 except that, in the step of preparing GaN seed crystal substrate 10p, GaN mother crystal A (GaN mother crystal 1) having average roughness Ra of 5 nm of the two main surfaces was sliced along a plane that is parallel with the {22-4-2} plane (along a plane perpendicular to the <22-4-2> direction) so as to cut out a plurality of GaN mother crystal pieces 1p each having a main surface of {22-4-2}, the main surfaces of the crystal pieces were ground and polished, and resultant GaN mother crystal pieces 1p having average roughness Ra of 5 nm of respective main surfaces were used. Referring to FIG. 7 (D), main surface 20pm of {22-4-2} of GaN single crystal substrate 20p has inclination angle α of 73° relative to (000-1) plane 20c.

As to the carrier concentration in main surface 20pm of GaN single crystal substrate 20p formed in the above-described manner, the average carrier concentration was $8.5 \times 10^{17}$ cm$^{-3}$, the minimum carrier concentration was $5.0 \times 10^{17}$ cm$^{-3}$, and the maximum carrier concentration was $1.25 \times 10^{18}$ cm$^{-3}$. Therefore, the variation of the carrier concentration relative to the average carrier concentration in the main surface was a small variation of −41.2% to +47.1%. As to the specific resistance in main surface 20pm of GaN single crystal substrate 20p, the average specific resistance was 0.015 Ω·cm, the minimum specific resistance was 0.008 Ω·cm, and the maximum specific resistance was 0.020 Ω·cm. Therefore, the variation of the specific resistance relative to the average specific resistance in the main surface was a small variation of −47% to +33%.

Further, this GaN single crystal substrate 20p was used to manufacture LEDs that are each a GaN-based semiconductor device, similarly to Example A1. As to the brightness of the main surfaces of the manufactured LEDs (GaN-based semiconductor devices 100), the LEDs had a large average relative brightness of 0.86 and a small sample variance of the relative brightness of 0.14. The results are summarized in Table 1.

Comparative Example RA1

Referring to FIG. 3 (A) to (D), GaN single crystal 20 was grown similarly to Example A1 except that, in the step of preparing GaN seed crystal substrate 10p, GaN mother crystal A (GaN mother crystal 1) having average roughness Ra of 5 nm of the two main surfaces was sliced along a plane that is parallel with the {10-10} plane (along a plane perpendicular to the <10-10> direction) so as to cut out a plurality of GaN mother crystal pieces 1p each having a main surface of {10-10}, the main surfaces of the crystal pieces were ground and polished, and resultant GaN mother crystal pieces 1p having average roughness Ra of 5 nm of respective main surfaces were used. GaN single crystal 20 was partially polycrystallized and cracked from the polycrystallized portion. Therefore, a GaN single crystal substrate could not be obtained and thus a GaN-based semiconductor device could not be manufactured. The results are summarized in Table 1.

Comparative Example RA2

Referring to FIG. 3 (A) to (D), GaN single crystal 20 was grown similarly to Example A1 except that, in the step of preparing GaN seed crystal substrate 10p, GaN mother crystal A (GaN mother crystal 1) having average roughness Ra of 5 nm of the two main surfaces was sliced along a plane that is parallel with the {11-20} plane (along a plane perpendicular to the <11-20> direction) so as to cut out a plurality of GaN mother crystal pieces 1p each having a main surface of {11-20}, the main surfaces of the crystal pieces were ground and polished, and resultant GaN mother crystal pieces 1p having average roughness Ra of 5 nm of respective main surfaces were used. GaN single crystal 20 was partially polycrystallized and cracked from the polycrystallized portion. Therefore, a GaN single crystal substrate could not be obtained and thus a GaN-based semiconductor device could not be manufactured. The results are summarized in Table 1.

Comparative Example RA3

Referring to FIG. 3 (A) to (D), GaN single crystal substrate 20p having main surface 20pm with the plane orientation of {10-11} was formed similarly to Example A1 except that, in the step of preparing GaN seed crystal substrate 10p, GaN mother crystal A (GaN mother crystal 1) having average roughness Ra of 5 nm of the two main surfaces was sliced along a plane that is parallel with the {10-11} plane (along a plane perpendicular to the <10-11> direction) so as to cut out a plurality of GaN mother crystal pieces 1p each having a main surface of {10-11}, the main surfaces of the crystal pieces were ground and polished, and resultant GaN mother crystal pieces 1p having average roughness Ra of 5 nm of respective main surfaces were used. The main surface of {10-11} of GaN single crystal substrate 20p has inclination angle α of 62° relative to a (0001) plane.

As to the carrier concentration in main surface 20pm of GaN single crystal substrate 20p formed in the above-described manner, the average carrier concentration was $4.5 \times 10^{17}$ cm$^{-3}$, the minimum carrier concentration was $3.5 \times 10^{16}$ cm$^{-3}$, and the maximum carrier concentration was $7.1 \times 10^{17}$ cm$^{-3}$. Therefore, the variation of the carrier concentration relative to the average carrier concentration in the main surface was a large variation of −92.2% to +57.8%. As to the specific resistance in main surface 20pm of GaN single crystal substrate 20p, the average specific resistance was 0.073 Ω·cm, the minimum specific resistance was 0.014 Ω·cm, and the maximum specific resistance was 0.29 Ω·cm. Therefore, the variation of the specific resistance relative to the average specific resistance in the main surface was a large variation of −81% to +297%.

Further, this GaN single crystal substrate 20p was used to manufacture LEDs that are each a GaN-based semiconductor device, similarly to Example A1. As to the brightness of the main surfaces of the manufactured LEDs (GaN-based semiconductor devices 100), the LEDs had a small average relative brightness of 0.55 and a large sample variance of the relative brightness of 0.35. The results are summarized in Table 1.

Comparative Example RA4

Referring to FIG. 3 (A) to (D), GaN single crystal substrate 20p having main surface 20pm with the plane orientation of {11-22} was formed similarly to Example A1 except that, in the step of preparing GaN seed crystal substrate 10p, GaN mother crystal A (GaN mother crystal 1) having average roughness Ra of 5 nm of the two main surfaces was sliced along a plane that is parallel with the {11-22} plane (along a plane perpendicular to the <11-22> direction) so as to cut out a plurality of GaN mother crystal pieces 1p each having a main surface of {11-22}, the main surfaces of the crystal pieces were ground and polished, and resultant GaN mother crystal pieces 1p having average roughness Ra of 5 nm of respective main surfaces were used. The main surface of {11-22} of GaN single crystal substrate 20p has inclination angle α of 58° relative to a (0001) plane.

As to the carrier concentration in main surface 20pm of GaN single crystal substrate 20p formed in the above-described manner, the average carrier concentration was $4.9 \times 10^{17}$ cm$^{-3}$, the minimum carrier concentration was $3.1 \times 10^{16}$ cm$^{-1}$, and the maximum carrier concentration was $6.8 \times 10^{17}$ cm$^{-3}$. Therefore, the variation of the carrier concentration relative to the average carrier concentration in the main surface was a large variation of −93.7% to +38.8%. As to the specific resistance in main surface 20pm of GaN single crystal substrate 20p, the average specific resistance was 0.11 Ω·cm, the minimum specific resistance was 0.015 Ω·cm, and the maximum specific resistance was 0.32 Ω·cm. Therefore, the variation of the specific resistance relative to the average specific resistance in the main surface was a large variation of −86% to +190%.

Further, this GaN single crystal substrate 20p was used to manufacture LEDs that are each a GaN-based semiconductor device, similarly to Example A1. As to the brightness of the main surfaces of the manufactured LEDs (GaN-based semiconductor devices 100), the LEDs had a small average relative brightness of 0.41 and a large sample variance of the relative brightness of 0.31. The results are summarized in Table 1.

Next, by means of etching with aqua regia, the GaAs substrate was removed from GaN mother crystal B to obtain GaN mother crystal B having a diameter of 50 mm and a thickness of 3 mm. The dislocation density of a main surface of GaN mother crystal B was measured by means of the CL (cathodoluminescence) method. Specifically, the dislocation density was measured at a pitch of 2 mm along two directions orthogonal to each other for a measurement area of 100 μm×100 μm in main surface 20pm. The average dislocation

TABLE 1

|  |  |  | Example A1 | Example A2 | Example A3 | Example A4 | Comparative Example RA1 | Comparative Example RA2 | Comparative Example RA3 | Comparative Example RA4 |
|---|---|---|---|---|---|---|---|---|---|---|
| GaN single crystal substrate | plane orientation of main surface | | {20-21} | {20-2-1} | {22-42} | {22-4-2} | {10-10} | {11-20} | {10-11} | {11-22} |
|  | inclination angle α (°) | | 75 | 75 | 73 | 73 | 90 | 90 | 62 | 58 |
|  | carrier concentration | average ($\times 10^{17}$ cm$^{-3}$) | 5.7 | 7.1 | 6.1 | 8.5 | partially polycrystallized, cracked | partially polycrystallized, cracked | 4.5 | 4.9 |
|  |  | min ($\times 10^{17}$ cm$^{-3}$) | 3.9 | 5.0 | 3.5 | 5.0 |  |  | 0.35 | 0.31 |
|  |  | max ($\times 10^{17}$ cm$^{-3}$) | 7.2 | 8.2 | 8.7 | 12.5 |  |  | 7.1 | 6.8 |
|  |  | variation (%) | −31.6 to +26.3 | −29.6 to +15.5 | −42.6 to +42.6 | −41.2 to +47.1 |  |  | −92.2 to +57.8 | −93.7 to +38.8 |
|  | specific resistance | average (Ω·cm) | 0.019 | 0.016 | 0.020 | 0.015 |  |  | 0.073 | 0.11 |
|  |  | min (Ω·cm) | 0.014 | 0.012 | 0.012 | 0.008 |  |  | 0.014 | 0.015 |
|  |  | max (Ω·cm) | 0.026 | 0.020 | 0.029 | 0.020 |  |  | 0.29 | 0.32 |
|  |  | variation (%) | −26 to +37 | −25 to +25 | −40 to +45 | −47 to +33 |  |  | −81 to +297 | −86 to +190 |
| GaN-based semiconductor device | relative brightness | average | 1.0 | 1.2 | 0.9 | 0.86 |  |  | 0.55 | 0.41 |
|  |  | sample variance | 0.12 | 0.11 | 0.14 | 0.14 |  |  | 0.35 | 0.31 |

As clearly seen from Table 1, a GaN single crystal substrate having a main surface of the plane orientation inclined by not less than 65° and not more than 85° with respect to one of a (0001) plane and a (000-1) plane, and having a substantially uniform distribution of the carrier concentration in the main surface (variation of the carrier concentration relative to the average carrier concentration in the main surface is within ±50%) could be used to obtain a GaN-based semiconductor device having a large average emission intensity of the main surface and a substantially uniform distribution of the emission intensity in the main surface (the sample variance of the relative brightness with respect to the average relative brightness in the main surface is 0.2 or less and thus the variation of the emission intensity relative to the average emission intensity is small).

Production of GaN Mother Crystal B

GaN mother crystal B was produced in the following manner. On a main surface of a (111)A plane of a GaAs substrate (base substrate) having a diameter of 50 mm and a thickness of 0.8 mm, an SiO layer (mask layer) was formed which had a thickness of 100 nm and in which a plurality of openings of 2 μm in diameter were arranged two-dimensionally in the hexagonal close-packed manner at a pitch of 4 μm. Next, on the main surface of the GaAs substrate on which the SiO layer with a plurality of openings was formed, the HVPE method was performed to grow a GaN low-temperature layer of 80 nm in thickness at 500° C. Then, a GaN intermediate layer of 60 μm in thickness was grown at 950° C. After this, at 1050° C., GaN mother crystal B of 5 mm in thickness was grown.

density was $3.1 \times 10^6$ cm$^{-2}$, the minimum dislocation density was $0.7 \times 10^6$ cm$^{-2}$, and the maximum dislocation density was $5.5 \times 10^6$ cm$^{-2}$.

Example B1

1. Preparation of GaN Seed Crystal Substrate

Referring to FIG. 5 (A), (0001) and (000-1) planes that are respectively the two main surfaces of GaN mother crystal B (GaN mother crystal 1) were ground and polished so that average roughness Ra of the two main surfaces was 5 nm. Here, average roughness Ra of the surfaces was measured by means of AFM.

Next, referring to FIG. 5 (A), GaN mother crystal 1 having average roughness Ra of 5 nm of the two main surfaces was sliced along a plane that is parallel with the {20-21} plane (along a plane perpendicular to the <20-21> direction), so that a plurality of GaN mother crystal pieces 1p having a main surface of {20-21} were cut out.

Subsequently, the four un-ground and un-polished sides of the cut-out GaN mother crystal pieces 1 each were ground and polished, so that average roughness Ra of these four sides was 5 nm. In this way, a plurality of GaN mother crystal pieces 1p having average roughness Ra of 5 nm of the main surface of {20-21} were obtained. These GaN mother crystal pieces 1p included a crystal piece having its main surface whose plane orientation is not exactly identical to {20-21}. Regarding any of the crystal pieces, however, the plane orientation of the main surface had an inclination angle within ±0.1° with respect to {20-21}. Here, the inclination angle was measured by the x-ray diffractometry.

Next, referring to FIG. 5 (B), a plurality of GaN mother crystal pieces 1p were arranged adjacently to each other in the lateral direction, in such a manner that respective main surfaces 1pm of {20-21} of a plurality of GaN mother crystal pieces 1p were parallel to each other and respective [0001] directions of these GaN mother crystal pieces 1p were identical. Further, the outer peripheral portion was partially removed so that the diameter was 50 mm.

Next, referring to FIG. 5 (C), main surfaces 1pm of {20-21} of a plurality of GaN mother crystal pieces 1p as described above were processed in a gas mixture atmosphere of 10 vol % of hydrogen chloride gas and 90 vol % of nitrogen gas and at 800° C. for two hours. After this, on main surfaces 1pm, the HVPE method was performed to grow GaN seed crystal 10 at a crystal growth temperature of 1050° C. and at a growth rate of 80 μm/hr four 50 hours.

Next, referring to FIG. 5 (C), (D) and FIG. 6 (A), above-described GaN seed crystal 10 was sliced along planes 10u, 10v that are parallel with main surfaces 1pm of {20-21} of a plurality of GaN mother crystal pieces 1p to obtain GaN seed crystal substrate 10p having main surface 10pm with the plane orientation of {120-21}, and having a diameter of 50 mm and a thickness of 0.5 mm. For GaN seed crystal substrate 10p, main surface 10pm was further ground and polished so that average roughness Ra of main surface 10pm was 5 nm. Main surface 10pm of {20-21} of GaN seed crystal substrate 10p has inclination angle α of 75° with respect to a (0001) plane.

The dislocation density in main surface 10pm of GaN seed crystal substrate 10p formed in the above-descried manner was measured by means of the CL (cathodoluminescence) method. Specifically, of the measurement points at a pitch of 2 mm along each of two directions orthogonal to each other, 400 measurement points from the center to the outer periphery in main surface 10pm except for measurement points in the peripheral portion were used for measuring the dislocation density for a measurement area of 100 μm×100 μm. The average dislocation density was $1.5 \times 10^6$ cm$^{-2}$, the minimum dislocation density was $1.0 \times 10^6$ cm$^{-2}$, and the maximum dislocation density was $3.5 \times 10^6$ cm$^{-2}$. Therefore, the variation of the dislocation density relative to the average dislocation density in the main surface was a large variation of −33% to +133%. A possible reason for this is as follows. GaN seed crystal substrate 10p was prepared using a plurality of GaN mother crystal pieces 1p. Therefore, GaN seed crystal substrate 10p had a part which was grown on a portion where GaN mother crystal pieces 1p were adjacent to each other and which had a higher dislocation density.

2. Growth of GaN Single Crystal

Referring to FIG. 6 (B), main surface 10pm of {20-21} of GaN seed crystal substrate 10p as described above was processed in a gas mixture atmosphere of 10 vol % of hydrogen chloride gas and 90 vol % of nitrogen gas and at 800° C. for two hours. After this, on this main surface 10pm, the HVPE method was performed to grow GaN single crystal 20 at a crystal growth temperature of 1050° C. and at a growth rate of 80 μm/hr four 50 hours.

3. Formation of GaN Single Crystal Substrate

Next, referring to FIG. 6 (B) and (C), above-described GaN single crystal 20 was sliced along planes 20u, 20v that are parallel with main surface 10pm of {20-21} of GaN seed crystal substrate 10p to obtain GaN single crystal substrate 20p having main surface 20pm with the plane orientation of {20-21}, and having a diameter of 50 mm and a thickness of 0.5 mm. For GaN single crystal substrate 20p, main surface 20pm was further ground and polished so that average roughness Ra of main surface 20pm was 5 nm. Referring to FIG. 7 (A), main surface 20pm of {20-21} of GaN single crystal substrate 20p has inclination angle α of 75° with respect to a (0001) plane.

The dislocation density in main surface 20pm of GaN single crystal substrate 20p formed in the above-descried manner was measured by means of the CL (cathodoluminescence) method. Specifically, of the measurement points at a pitch of 2 mm along each of two directions orthogonal to each other, 400 measurement points from the center to the outer periphery in main surface 20pm except for measurement points in the peripheral portion were used for measuring the dislocation density for a measurement area of 100 μm×100 μm. The average dislocation density was $5.4 \times 10^5$ cm$^{-2}$, the minimum dislocation density was $2.9 \times 10^5$ cm$^{-2}$, and the maximum dislocation density was $7.5 \times 10^5$ cm$^{-2}$. Therefore, the variation of the dislocation density relative to the average dislocation density in the main surface was −46.3% to +38.9%.

In the whole of main surface 20pm of GaN single crystal substrate 20p, the half width of an x-ray diffraction peak obtained by x-ray diffraction rocking curve measurement where (0002) and (22-40) planes were crystal planes of diffraction was a small value of 30 arc sec to 100 arc sec. Thus, main surface 20pm of GaN single crystal substrate 20p had high crystallinity. Here, x-ray diffraction rocking curve measurement was performed by means of X'Pert Pro MRD of PANalytical (formerly Philips Analytical) at 400 measurement points from the center toward the outer periphery in main surface 20pm except for measurement points in the peripheral portion, at a pitch of 2 mm along each of two directions orthogonal to each other, and with an x-ray irradiation area of 1 mm².

4. Manufacture of GaN-Based Semiconductor Device

Referring next to FIG. 8, on one main surface 20pm of GaN single crystal substrate 20p (50 mm in diameter×0.4 mm in thickness), the MOCVD method was performed to grow at least one GaN-based semiconductor layer 130. Specifically, Si-doped n-type GaN layer 131 having a thickness of 2 μm (carrier concentration: $2 \times 10^{18}$ cm$^{-3}$), light emitting layer 132 having a multiple quantum well structure formed of six pairs of an $In_{0.01}Ga_{0.99}N$ barrier layer and an $In_{0.1}Ga_{0.9}N$ well layer and having a thickness of 100 nm, Mg-doped p-type $Al_{0.18}Ga_{0.82}N$ layer 133 having a thickness of 20 nm (carrier concentration: $3 \times 10^{17}$ cm$^{-3}$), and Mg-doped p-type GaN layer 134 having a thickness of 50 nm (carrier concentration: $1 \times 10^{18}$ cm$^{-3}$) were grown in order.

Next, by the vacuum deposition method, Ni/Au electrodes of 0.2 mm×0.2 mm×0.5 μm in thickness were formed as p-side electrodes 141 at a pitch of 1 mm along two directions orthogonal to each other on p-type GaN layer 134. Further, by the vacuum deposition method, a Ti/Al electrode of 1 μm in thickness was formed as n-side electrode 142 on the other main surface 20pn of GaN single crystal substrate 20p.

Then, a wafer including above-described at least one GaN-based semiconductor layer 130 formed on GaN single crystal substrate 20p was divided into a plurality of chips of 1 mm×1 mm, namely GaN-based semiconductor devices (chips were generated from the wafer), so that each p-side electrode is located at a center of each chip, except for an outer peripheral portion in the wafer, for which the distribution of the carrier concentration and the specific resistance was not measured, in main surface 20pm of GaN single crystal substrate 20p. GaN-based semiconductor device 100 obtained in this manner was an LED (light emitting diode) having an emission peak wavelength of 450 nm.

The brightness of the main surface of the LED (GaN-based semiconductor device 100) manufactured in the above-described manner was measured by means of a brightness measurement integrating sphere, for 1600 LEDs in the form of chips as described above. The average brightness of LEDs obtained in the present Example B1 was used as an average relative brightness of 1.0, and the average relative brightness as well as the sample variance of the relative brightness were expressed for each of Examples B1 to B4 and Comparative Examples RB3, RB4. The LEDs manufactured in this Example B1 had a large average relative brightness of 1.0, and a small sample variance of the relative brightness of 0.12. The results are summarized in Table 2.

Example B2

Referring to FIG. 5 (A) to (D) and FIG. 6 (A) to (C), GaN seed crystal substrate 10$p$ having main surface 10$pm$ with the plane orientation of {20-2-1} and GaN single crystal substrate 20$p$ having main surface 20$pm$ with the plane orientation of {20-2-1} were formed similarly to Example B1 except that, in the step of preparing GaN seed crystal substrate 10$p$, GaN mother crystal B (GaN mother crystal 1) having average roughness Ra of 5 nm of the two main surfaces was sliced along a plane that is parallel with the {20-2-1} plane (along a plane perpendicular to the <20-2-1> direction) so as to cut out a plurality of GaN mother crystal pieces 1$p$ each having a main surface of {20-2-1}, the main surfaces of the crystal pieces were ground and polished, and resultant GaN mother crystal pieces 1$p$ having average roughness Ra of 5 nm of respective main surfaces were used. Referring to FIG. 7 (B), main surface 20$pm$ of {20-2-1} of GaN single crystal substrate 20$p$ has inclination angle α of 75° relative to a (000-1) plane.

As to the dislocation density in main surface 10$pm$ of resultant GaN seed crystal substrate 10$p$, the average dislocation density was $1.1 \times 10^6$ cm$^{-2}$, the minimum dislocation density was $7.8 \times 10^5$ cm$^{-2}$, and the maximum dislocation density was $2.4 \times 10^6$ cm$^{-2}$. Therefore, the variation of the dislocation density relative to the average dislocation density in the main surface was a large variation of −29% to +118%.

In contrast, as to the dislocation density in main surface 20$pm$ of resultant GaN single crystal substrate 20$p$, the average dislocation density was $3.2 \times 10^5$ cm$^{-2}$, the minimum dislocation density was $0.0 \times 10^5$ cm$^{-2}$, and the maximum dislocation density was $4.2 \times 10^5$ cm$^{-2}$. Therefore, the variation of the dislocation density relative to the average dislocation density in the main surface was a small variation of −100% to +31.3%. Further, in the whole of main surface 20$pm$ of GaN single crystal substrate 20$p$, x-ray diffraction rocking curve measurement where (0002) and (22-40) planes were crystal planes of diffraction was performed and a half width of the x-ray diffraction peak was a small half width of 30 arc sec to 100 arc sec. Thus, main surface 20$pm$ of GaN single crystal substrate 20$p$ had high crystallinity.

Further, this GaN single crystal substrate 20$p$ was used to manufacture LEDs that are each a GaN-based semiconductor device, similarly to Example B1. As to the brightness of the main surfaces of the manufactured LEDs (GaN-based semiconductor devices 100), the LEDs had a large average relative brightness of 1.2 and a small sample variance of the relative brightness of 0.11. The results are summarized in Table 2.

Example B3

Referring to FIG. 5 (A) to (D) and FIG. 6 (A) to (C), GaN seed crystal substrate 10$p$ having main surface 10$pm$ with the plane orientation of {22-42} and GaN single crystal substrate 20$p$ having main surface 20$pm$ with the plane orientation of {22-42} were formed similarly to Example B1 except that, in the step of preparing GaN seed crystal substrate 10$p$, GaN mother crystal B (GaN mother crystal 1) having average roughness Ra of 5 nm of the two main surfaces was sliced along a plane that is parallel with the {22-42} plane (along a plane perpendicular to the <22-42> direction) so as to cut out a plurality of GaN mother crystal pieces 1$p$ each having a main surface of {22-42}, the main surfaces of the crystal pieces were ground and polished, and resultant GaN mother crystal pieces 1$p$ having average roughness Ra of 5 nm of respective main surfaces were used. Referring to FIG. 7 (C), main surface 20$pm$ of {22-42} of GaN single crystal substrate 20$p$ has inclination angle α of 73° relative to a (0001) plane.

As to the dislocation density in main surface 10$pm$ of resultant GaN seed crystal substrate 10$p$, the average dislocation density was $1.6 \times 10^6$ cm$^{-2}$, the minimum dislocation density was $1.2 \times 10^6$ cm$^{-2}$, and the maximum dislocation density was $3.9 \times 10^6$ cm$^{-2}$. Therefore, the variation of the dislocation density relative to the average dislocation density in the main surface was a large variation of −25% to +144%.

In contrast, as to the dislocation density in main surface 20$pm$ of resultant GaN single crystal substrate 20$p$, the average dislocation density was $6.9 \times 10^5$ cm$^{-2}$, the minimum dislocation density was $3.5 \times 10^5$ cm$^{-2}$, and the maximum dislocation density was $9.8 \times 10^5$ cm$^{-2}$. Therefore, the variation of the dislocation density relative to the average dislocation density in the main surface was a small variation of −49.3% to +42.0%. Further, in the whole of main surface 20$pm$ of GaN single crystal substrate 20$p$, x-ray diffraction rocking curve measurement where (0002) and (20-20) planes were crystal planes of diffraction was performed and a half width of the x-ray diffraction peak was a small half width of 30 arc sec to 100 arc sec. Thus, main surface 20$pm$ of GaN single crystal substrate 20$p$ had high crystallinity.

Further, this GaN single crystal substrate 20$p$ was used to manufacture LEDs that are each a GaN-based semiconductor device, similarly to Example B1. As to the brightness of the main surfaces of the manufactured LEDs (GaN-based semiconductor devices 100), the LEDs had a large average relative brightness of 0.9 and a small sample variance of the relative brightness of 0.14. The results are summarized in Table 2.

Example B4

Referring to FIG. 5 (A) to (D) and FIG. 6 (A) to (C), GaN seed crystal substrate 10$p$ having main surface 10$pm$ with the plane orientation of {22-4-2} and GaN single crystal substrate 20$p$ having main surface 20$pm$ with the plane orientation of {22-4-2} were formed similarly to Example B1 except that, in the step of preparing GaN seed crystal substrate 10$p$, GaN mother crystal B (GaN mother crystal 1) having average roughness Ra of 5 nm of the two main surfaces was sliced along a plane that is parallel with the {22-4-2} plane (along a plane perpendicular to the <22-4-2> direction) so as to cut out a plurality of GaN mother crystal pieces 1$p$ each having a main surface of {22-4-2}, the main surfaces of the crystal pieces were ground and polished, and resultant GaN mother crystal pieces 1$p$ having average roughness Ra of 5 nm of respective main surfaces were used. Referring to FIG. 7 (D), main surface 20$pm$ of {22-4-2} of GaN single crystal substrate 20$p$ has inclination angle α, of 73° relative to a (000-1) plane.

As to the dislocation density in main surface 10$pm$ of resultant GaN seed crystal substrate 10$p$, the average dislocation density was $2.2 \times 10^6$ cm$^{-2}$, the minimum dislocation density was $1.4 \times 10^6$ cm$^{-2}$, and the maximum dislocation density was $5.5 \times 10^6$ cm$^{-2}$. Therefore, the variation of the dislocation density relative to the average dislocation density in the main surface was a large variation of −36% to +150%.

In contrast, as to the dislocation density in main surface 20pm of resultant GaN single crystal substrate 20p, the average dislocation density was $8.9\times10^5$ cm$^{-2}$, the minimum dislocation density was $3.8\times10^5$ cm$^{-2}$, and the maximum dislocation density was $1.5\times10^6$ cm$^{-2}$. Therefore, the variation of the dislocation density relative to the average dislocation density in the main surface was a small variation of −57.3% to +68.5%. Further, in the whole of main surface 20pm of GaN single crystal substrate 20p, x-ray diffraction rocking curve measurement where (0002) and (22-20) planes were crystal planes of diffraction was performed and a half width of the x-ray diffraction peak was a small half width of 30 arc sec to 100 arc sec. Thus, main surface 20pm of GaN single crystal substrate 20p had high crystallinity.

Further, this GaN single crystal substrate 20p was used to manufacture LEDs that are each a GaN-based semiconductor device, similarly to Example B1. As to the brightness of the main surfaces of the manufactured LEDs (GaN-based semiconductor devices 100), the LEDs had a large average relative brightness of 0.86 and a small sample variance of the relative brightness of 0.14. The results are summarized in Table 2.

Comparative Example RB1

Referring to FIG. 5 (A) to (D) and FIG. 6 (A) to (C), GaN seed crystal 10 was grown similarly to Example B1 except that, in the step of preparing GaN seed crystal substrate 10p, GaN mother crystal B (GaN mother crystal 1) having average roughness Ra of 5 nm of the two main surfaces was sliced along a plane that is parallel with the {10-10} plane (along a plane perpendicular to the <10-10> direction) so as to cut out a plurality of GaN mother crystal pieces 1p each having a main surface of {10-10}, the main surfaces of the crystal pieces were ground and polished, and resultant GaN mother crystal pieces 1p having average roughness Ra of 5 nm of respective main surfaces were used. GaN seed crystal 10 was partially polycrystallized and cracked from the polycrystallized portion. Therefore, a GaN seed crystal substrate could not be obtained and thus a GaN single crystal substrate and a GaN-based semiconductor device could not be manufactured. The results are summarized in Table 2.

Comparative Example RB2

Referring to FIG. 5 (A) to (D) and FIG. 6 (A) to (C), GaN seed crystal 10 was grown similarly to Example B1 except that, in the step of preparing GaN seed crystal substrate 10p, GaN mother crystal B (GaN mother crystal 1) having average roughness Ra of 5 nm of the two main surfaces was sliced along a plane that is parallel with the {11-20} plane (along a plane perpendicular to the <11-20> direction) so as to cut out a plurality of GaN mother crystal pieces 1p each having a main surface of {11-20}, the main surfaces of the crystal pieces were ground and polished, and resultant GaN mother crystal pieces 1p having average roughness Ra of 5 nm of respective main surfaces were used. GaN seed crystal 10 was partially polycrystallized and cracked from the polycrystallized portion. Therefore, a GaN seed crystal substrate could not be obtained and thus a GaN single crystal substrate and a GaN-based semiconductor device could not be manufactured. The results are summarized in Table 2.

Comparative Example RB3

Referring to FIG. 5 (A) to (D) and FIG. 6 (A) to (C), GaN seed crystal substrate 10p having main surface 10pm with the plane orientation of {10-11} and GaN single crystal substrate 20p having main surface 20pm with the plane orientation of {10-11} were formed similarly to Example B1 except that, in the step of preparing GaN seed crystal substrate 10p, GaN mother crystal B (GaN mother crystal 1) having average roughness Ra of 5 nm of the two main surfaces was sliced along a plane that is parallel with the {10-11} plane (along a plane perpendicular to the <10-11> direction) so as to cut out a plurality of GaN mother crystal pieces 1p each having a main surface of {10-11}, the main surfaces of the crystal pieces were ground and polished, and resultant GaN mother crystal pieces 1p having average roughness Ra of 5 nm of respective main surfaces were used. Main surface 20pm of {10-11} of GaN single crystal substrate 20p has inclination angle α of 62° relative to a (0001) plane.

As to the dislocation density in main surface 10pm of resultant GaN seed crystal substrate 10p, the average dislocation density was $4.0\times10^6$ cm$^{-2}$, the minimum dislocation density was $2.2\times10^6$ cm$^{-2}$, and the maximum dislocation density was $9.5\times10^6$ cm$^{-2}$. Therefore, the variation of the dislocation density relative to the average dislocation density in the main surface was a large variation of −45% to +138%.

Further, as to the dislocation density in main surface 20pm of resultant GaN single crystal substrate 20p, the average dislocation density was $3.2\times10^6$ cm$^{-2}$, the minimum dislocation density was $1.1\times10^6$ cm$^{-2}$, and the maximum dislocation density was $7.5\times10^6$ cm$^{-2}$. Therefore, the variation of the dislocation density relative to the average dislocation density in the main surface was a large variation of −65.7% to +134%. In the whole of main surface 20pm of GaN single crystal substrate 20p, x-ray diffraction rocking curve measurement where (0002) and (22-40) planes were crystal planes of diffraction was performed and a half width of the x-ray diffraction peak was a large half width of 120 arc sec to 350 arc sec. Thus, main surface 20pm of GaN single crystal substrate 20p had low crystallinity.

Further, this GaN single crystal substrate 20p was used to manufacture LEDs that are each a GaN-based semiconductor device, similarly to Example B1. As to the brightness of the main surfaces of the manufactured LEDs (GaN-based semiconductor devices 100), the LEDs had a small average relative brightness of 0.55 and a large sample variance of the relative brightness of 0.35. The results are summarized in Table 2.

Comparative Example RB4

Referring to FIG. 5 (A) to (D) and FIG. 6 (A) to (C), GaN seed crystal substrate 10p having main surface 10pm with the plane orientation of {11-22} and GaN single crystal substrate 20p having main surface 20pm with the plane orientation of {11-22} were formed similarly to Example B1 except that, in the step of preparing GaN seed crystal substrate 10p, GaN mother crystal B (GaN mother crystal 1) having average roughness Ra of 5 nm of the two main surfaces was sliced along a plane that is parallel with the {11-22} plane (along a plane perpendicular to the <11-22> direction) so as to cut out a plurality of GaN mother crystal pieces 1p each having a main surface of {11-22}, the main surfaces of the crystal pieces were ground and polished, and resultant GaN mother crystal pieces 1p having average roughness Ra of 5 nm of respective main surfaces were used. Main surface 20pm of {11-22} of GaN single crystal substrate 20p has inclination angle α of 58° relative to a (0001) plane.

As to the dislocation density in main surface 10pm of resultant GaN seed crystal substrate 10p, the average dislocation density was $4.7\times10^6$ cm$^{-2}$, the minimum dislocation density was $2.8 \times 10^6$ cm$^{-2}$, and the maximum dislocation density was $9.8 \times 10^6$ cm$^{-2}$. Therefore, the variation of the dislocation density relative to the average dislocation density in the main surface was a large variation of −40% to +109%.

Further, as to the dislocation density in main surface 20pm of resultant GaN single crystal substrate 20p, the average dislocation density was $4.6 \times 10^6$ cm$^{-2}$, the minimum dislocation density was $2.2 \times 10^6$ cm$^{-2}$, and the maximum dislocation density was $9.3 \times 10^6$ cm$^{-2}$. Therefore, the variation of the dislocation density relative to the average dislocation density in the main surface was a large variation of −52.2% to +102%. In the whole of main surface 20pm of GaN single crystal substrate 20p, x-ray diffraction rocking curve measurement where (0002) and (20-20) planes were crystal planes of diffraction was performed and a half width of the x-ray diffraction peak was a large half width of 120 arc sec to 350 arc sec. Thus, main surface 20pm of GaN single crystal substrate 20p had low crystallinity.

Further, this GaN single crystal substrate 20p was used to manufacture LEDs that are each a GaN-based semiconductor device, similarly to Example B1. As to the brightness of the main surfaces of the manufactured LEDs (GaN-based semiconductor devices 100), the LEDs had a small average relative brightness of 0.41 and a large sample variance of the relative brightness of 0.31. The results are summarized in Table 2.

sion intensity in the main surface (the sample variance of the relative brightness with respect to the average relative brightness in the main surface is 0.2 or less and thus the variation of the emission intensity relative to the average emission intensity is small).

Production of GaN Mother Crystal C

GaN mother crystal C was produced in the following manner. On a main surface of a (111) A plane of a GaAs substrate (base substrate) having a diameter of 50 mm and a thickness of 0.8 mm, an SiO layer (mask layer) was formed which had a thickness of 100 nm and in which a plurality of openings of 2 μm in diameter were arranged two-dimensionally in the hexagonal close-packed manner at a pitch of 4 μm, by photolithography and etching. Next, on the main surface of the GaAs substrate on which the SiO layer with a plurality of openings was formed, the HVPE method was performed to grow a GaN low-temperature layer of 80 nm in thickness at 500° C. Then, a GaN intermediate layer of 60 μm in thickness was grown at 950° C. After this, at 1050° C., GaN mother crystal C of 5 mm in thickness was grown. Next, by means of etching with aqua regia, the GaAs substrate was removed from GaN mother crystal C to obtain GaN mother crystal C having a diameter of 50 mm and a thickness of 3 mm. Photoelasticity distortion in the main surface of GaN mother crystal C was measured by means of a red LD (laser diode) with a peak wavelength of 660 nm, following the method

TABLE 2

| | | Example B1 | Example B2 | Example B3 | Example B4 | Comparative Example RB1 | Comparative Example RB2 | Comparative Example RB3 | Comparative Example RB4 |
|---|---|---|---|---|---|---|---|---|---|
| GaN seed crystal substrate | plane orientation of main surface | {20-21} | {20-2-1} | {22-42} | {22-4-2} | {10-10} | {11-20} | {10-11} | {11-22} |
| | inclination angle α (°) | 75 | 75 | 73 | 73 | 90 | 90 | 62 | 58 |
| | dislocation density average ($\times 10^5$ cm$^{-2}$) | 15 | 11 | 16 | 22 | partially poly-crystallized, cracked | partially poly-crystallized, cracked | 40 | 47 |
| | min ($\times 10^5$ cm$^{-2}$) | 10 | 7.8 | 12 | 14 | | | 22 | 28 |
| | max ($\times 10^5$ cm$^{-2}$) | 35 | 24 | 39 | 55 | | | 95 | 98 |
| | variation (%) | −33 to +133 | −29 to +118 | −25 to +144 | −36 to +150 | | | −45 to +138 | −40 to +109 |
| GaN single crystal substrate | plane orientation of main surface | {20-21} | {20-2-1} | {22-42} | {22-4-2} | | | {10-11} | {11-22} |
| | inclination angle α (°) | 75 | 75 | 73 | 73 | | | 62 | 58 |
| | dislocation density average ($\times 10^5$ cm$^{-2}$) | 5.4 | 3.2 | 6.9 | 8.9 | | | 32 | 46 |
| | min ($\times 10^5$ cm$^{-2}$) | 2.9 | 0.0 | 3.5 | 3.8 | | | 11 | 22 |
| | max ($\times 10^5$ cm$^{-2}$) | 7.5 | 4.2 | 9.8 | 15 | | | 75 | 93 |
| | variation (%) | −46.3 to +38.9 | −100 to +31.3 | −49.3 to +42.0 | −57.3 to +68.5 | | | −65.7 to +134 | −52.2 to +102 |
| | x-ray diffraction diffraction crystal plane | (0002) (22-40) | (0002) (22-40) | (0002) (20-20) | (0002) (20-20) | | | (0002) (22-40) | (0002) (20-20) |
| | half width of peak (arcsec) | 30 to 100 | 30 to 100 | 30 to 100 | 30 to 100 | | | 120 to 350 | 120 to 350 |
| GaN-based semiconductor device | relative brightness average | 1.0 | 1.2 | 0.9 | 0.86 | | | 0.55 | 0.41 |
| | sample variance | 0.12 | 0.11 | 0.14 | 0.14 | | | 0.35 | 0.31 |

As clearly seen from Table 2, a GaN single crystal substrate having a main surface of the plane orientation inclined by not less than 65° and not more than 85° with respect to one of a (0001) plane and a (000-1) plane, and having a substantially uniform distribution of the dislocation density in the main surface (variation of the dislocation density relative to the average dislocation density in the main surface is within ±100%) could be used to obtain a GaN-based semiconductor device having a large average emission intensity of the main surface and a substantially uniform distribution of the emission intensity in the main surface (the sample variance of the relative brightness with respect to the average relative brightness in the main surface is 0.2 or less and thus the variation of the emission intensity relative to the average emission intensity is small).

illustrated in Embodiment 1C, at an ambient temperature of 25° C. and at a pitch of 2 mm in each of two directions orthogonal to each other in the main surface ((0001) plane 1c). Regarding the photoelasticity distortion value, the average value was $9.0 \times 10^{-6}$, the minimum value was $3.1 \times 10^{-7}$, and the maximum value was $2.1 \times 10^{-5}$.

Example C1

1. Preparation of GaN Seed Crystal Substrate

Referring to FIG. 5 (A), (0001) and (000-1) planes that are respectively the two main surfaces of GaN mother crystal C (GaN mother crystal 1) were ground and polished so that average roughness Ra of the two main surfaces was 5 nm. Here, average roughness Ra of the surfaces was measured by means of AFM.

Next, referring to FIG. 5 (A), GaN mother crystal 1 having average roughness Ra of 5 nm of the two main surfaces was sliced along a plane that is parallel with the {20-21} plane (along a plane perpendicular to the <20-21> direction), so that a plurality of GaN mother crystal pieces 1p having a main surface of {20-21} were cut out.

Subsequently, the four un-ground and un-polished sides of the cut-out GaN mother crystal pieces 1p each were ground and polished, so that average roughness Ra of these four sides was 5 nm. In this way, a plurality of GaN mother crystal pieces 1p having average roughness Ra of 5 nm of the main surface of {20-21} were obtained. These GaN mother crystal pieces 1p included a crystal piece having its main surface whose plane orientation is not exactly identical to {20-21}. Regarding any of the crystal pieces, however, the plane orientation of the main surface had an inclination angle within ±0.1° with respect to {20-21}. Here, the inclination angle was measured by the x-ray diffractometry.

Next, referring to FIG. 5 (B), a plurality of GaN mother crystal pieces 1p were arranged adjacently to each other in the lateral direction, in such a manner that respective main surfaces 1pm of {20-21} of a plurality of GaN mother crystal pieces 1p were parallel to each other and respective [0001] directions of these GaN mother crystal pieces 1p were identical. Further, the outer peripheral portion was partially removed so that the diameter was 50 mm.

Next, referring to FIG. 5 (C), main surfaces 1pm of {20-21} of a plurality of GaN mother crystal pieces 1p as described above were processed in a gas mixture atmosphere of 10 vol % of hydrogen chloride gas and 90 vol % of nitrogen gas and at 800° C. for two hours. After this, on main surfaces 1pm, the HVPE method was performed to grow GaN seed crystal 10 at a crystal growth temperature of 1050° C. and at a growth rate of 80 μm/hr four 50 hours.

Next, referring to FIG. 5 (C), (D) and FIG. 6 (A), above-described GaN seed crystal 10 was sliced along planes 10u, 10v that are parallel with main surfaces 1pm of {20-21} of a plurality of GaN mother crystal pieces 1p to obtain GaN seed crystal substrate 10p having main surface 10pm with the plane orientation of {20-21}, and having a diameter of 50 mm and a thickness of 0.5 mm. For GaN seed crystal substrate 10p, main surface 10pm was further ground and polished so that average roughness Ra of main surface 10pm was 5 nm. Main surface 10pm of {20-21} of GaN seed crystal substrate 10p has inclination angle α of 75° with respect to a (0001) plane.

As to the photoelasticity distortion value in main surface 10pm of GaN seed crystal substrate 10p formed in the above described manner, the photoelasticity distortion was measured by means of a red LD with a peak wavelength of 660 nm, following the method illustrated in Embodiment 1C, at an ambient temperature of 25° C., and at 400 measurement points from the center toward the outer periphery in main surface 10pm, except for measurement points in the peripheral portion, among measurement points at a pitch of 2 mm in each of two directions orthogonal to each other. Regarding the value of the photoelasticity distortion, the average value was $2.1 \times 10^{-5}$, the minimum value was $4.9 \times 10^{-7}$, and the maximum value was $7.4 \times 10^{-5}$. Therefore, the photoelasticity distortion value in the main surface was a large value of $7.4 \times 10^{-5}$ or less, and the variation relative to the average value was also a large variation of −98% to +252%. A possible reason for this is as follows. GaN seed crystal substrate 10p was prepared using a plurality of GaN mother crystal pieces 1p. Therefore, GaN crystal substrate 10p had a part which was grown on a portion where GaN mother crystal pieces 1p were adjacent to each other and which had a higher photoelasticity distortion value.

2. Growth of GaN Single Crystal

Referring to FIG. 6 (B), main surface 10pm of {20-21} of GaN seed crystal substrate 10p as described above was processed in a gas mixture atmosphere of 10 vol % of hydrogen chloride gas and 90 vol % of nitrogen gas and at 800° C. for two hours. After this, on this main surface 10pm, the HVPE method was performed to grow GaN single crystal 20 at a crystal growth temperature of 1050° C. and at a growth rate of 80 μm/hr four 50 hours.

3. Formation of GaN Single Crystal Substrate

Next, referring to FIG. 6 (B) and (C), above-described GaN single crystal 20 was sliced along planes 20u, 20v that are parallel with main surface 10pm of {20-21} of GaN seed crystal substrate 10p to obtain GaN single crystal substrate 20p having main surface 20pm with the plane orientation of {20-21}, and having a diameter of 50 mm and a thickness of 0.5 mm. For GaN single crystal substrate 20p, main surface 20pm was further ground and polished so that average roughness Ra of main surface 20pm was 5 nm. Referring to FIG. 7 (A), main surface 20pm of {20-21} of GaN single crystal substrate 20p has inclination angle α of 75° with respect to a (0001) plane.

As to the photoelasticity distortion value in main surface 20pm of GaN single crystal substrate 20p formed in the above described manner, the photoelasticity distortion was measured by means of a red LD with a peak wavelength of 660 nm, following the method illustrated in Embodiment 1C, at an ambient temperature of 25° C., and at 400 measurement points from the center toward the outer periphery in main surface 10pm, except for measurement points in the peripheral portion, among measurement points at a pitch of 2 mm in each of two directions orthogonal to each other. Regarding the value of the photoelasticity distortion, the average value was $8.3 \times 10^{-6}$, the minimum value was $2.6 \times 10^{-7}$, and the maximum value was $1.5 \times 10^{-5}$. Therefore, the photoelasticity distortion value in the main surface was a small value of $1.5 \times 10^{-5}$ or less, and the variation relative to the average value was also a small variation of −96.9% to +80.7%.

In the whole of main surface 20pm of GaN single crystal substrate 20p, the half width of an x-ray diffraction peak obtained by x-ray diffraction rocking curve measurement where (0002) and (22-40) planes were crystal planes of diffraction was a small value of 30 arc sec to 100 arc sec. Thus, main surface 20pm of GaN single crystal substrate 20p had high crystallinity. Here, x-ray diffraction rocking curve measurement was performed by means of X'Pert Pro MRD of PANalytical (formerly Philips Analytical) at 400 measurement points from the center toward the outer periphery in main surface 20pm, except for measurement points in the peripheral portion, at a pitch of 2 mm along each of two directions orthogonal to each other, and with an x-ray irradiation area of 1 mm².

4. Manufacture of GaN-Based Semiconductor Device

Next, referring next to FIG. 8, on one main surface 20pm of GaN single crystal substrate 20p (50 mm in diameter×0.4 mm in thickness), the MOCVD method was performed to grow at least one GaN-based semiconductor layer 130. Specifically, Si-doped n-type GaN layer 131 having a thickness of 2 μm (carrier concentration: $2 \times 10^{18}$ cm$^{-3}$), light emitting layer 132 having a multiple quantum well structure formed of six pairs of an $In_{0.01}Ga_{0.99}N$ barrier layer and an $In_{0.1}Ga_{0.9}N$ well layer and having a thickness of 100 nm, Mg-doped p-type $Al_{0.18}Ga_{0.82}N$ layer 133 having a thickness of 20 nm (carrier concentration: $3\times10^{17}$ cm$^{-3}$), and Mg-doped p-type GaN layer 134 having a thickness of 50 nm (carrier concentration: $1\times10^{18}$ cm$^{-3}$) were grown in order.

Next, by the vacuum deposition method, Ni/Au electrodes of 0.2 mm×0.2 mm×0.5 μm in thickness were formed as p-side electrodes 141 at a pitch of 1 mm along two directions orthogonal to each other on p-type GaN layer 134. Further, by the vacuum deposition method, a Ti/Al electrode of 1 μm in thickness was formed as n-side electrode 142 on the other main surface 20pn of GaN single crystal substrate 20p.

Then, a wafer including above-described at least one GaN-based semiconductor layer 130 formed on GaN single crystal substrate 20p was divided into a plurality of chips of 1 mm×1 mm, namely GaN-based semiconductor devices (chips were generated from the wafer), so that each p-side electrode is located at a center of each chip, except for an outer peripheral portion in the wafer, for which the photoelasticity distortion value was not measured, in main surface 20pm of GaN single crystal substrate 20p. GaN-based semiconductor device 100 obtained in this manner was an LED (light emitting diode) having an emission peak wavelength of 450 nm.

The brightness of the main surface of the LED (GaN-based semiconductor device 100) manufactured in the above-described manner was measured by means of a brightness measurement integrating sphere, for 1600 LEDs in the form of chips as described above. The average brightness of LEDs obtained in the present Example C1 was used as an average relative brightness of 1.0, and the average relative brightness as well as the sample variance of the relative brightness were expressed for each of Examples C1 to C4 and Comparative Examples RC3, RC4. The LEDs manufactured in this Example C1 had a large average relative brightness of 1.0, and a small sample variance of the relative brightness of 0.15. The results are summarized in Table 3.

Example C2

Referring to FIG. 5 (A) to (D) and FIG. 6 (A) to (C), GaN seed crystal substrate 10p having main surface 10pm with the plane orientation of {20-2-1} and GaN single crystal substrate 20p having main surface 20pm with the plane orientation of {20-2-1} were formed similarly to Example C1 except that, in the step of preparing GaN seed crystal substrate 10p, GaN mother crystal C (GaN mother crystal 1) having average roughness Ra of 5 nm of the two main surfaces was sliced along a plane that is parallel with the {20-2-1} plane (along a plane perpendicular to the <20-2-1> direction) so as to cut out a plurality of GaN mother crystal pieces 1p each having a main surface of {20-2-1}, the main surfaces of the crystal pieces were ground and polished, and resultant GaN mother crystal pieces 1p having average roughness Ra of 5 nm of respective main surfaces were used. Referring to FIG. 7 (B), main surface 20pm of {20-2-1} of GaN single crystal substrate 20p has inclination angle α of 75° relative to a (000-1) plane.

As to the photoelasticity distortion value in main surface 10pm of resultant GaN seed crystal substrate 10p, the average value was $1.9\times10^{-5}$, the minimum value was $3.2\times10^{-7}$, and the maximum value was $6.5\times10^{-5}$. Therefore, the photoelasticity distortion value in the main surface was a large value of $6.5\times10^{-5}$ or less, and the variation relative to the average value was also a large variation of −98% to +242%.

In contrast, as to the photoelasticity distortion value in main surface 20pm of resultant GaN single crystal substrate 20p, the average value was $5.4\times10^{-6}$, the minimum value was $1.1\times10^{-7}$, and the maximum value was $9.4\times10^{-6}$. Therefore, the photoelasticity distortion value in the main surface was a small value of $9.4\times10^{-6}$ or less, and the variation relative to the average was also a small variation of −98.0% to +74.1%. Further, in the whole of main surface 20pm of GaN single crystal substrate 20p, x-ray diffraction rocking curve measurement where (0002) and (22-40) planes were crystal planes of diffraction was performed and a half width of the x-ray diffraction peak was a small half width of 30 arc sec to 100 arc sec. Thus, main surface 20pm of GaN single crystal substrate 20p had high crystallinity.

Further, this GaN single crystal substrate 20p was used to manufacture LEDs that are each a GaN-based semiconductor device, similarly to Example C1. As to the brightness of the main surfaces of the manufactured LEDs (GaN-based semiconductor devices 100), the LEDs had a large average relative brightness of 1.1 and a small sample variance of the relative brightness of 0.11. The results are summarized in Table 3.

Example C3

Referring to FIG. 5 (A) to (D) and FIG. 6 (A) to (C), GaN seed crystal substrate 10p having main surface 10pm with the plane orientation of {22-42} and GaN single crystal substrate 20p having main surface 20pm with the plane orientation of {22-42} were formed similarly to Example C1 except that, in the step of preparing GaN seed crystal substrate 10p, GaN mother crystal C (GaN mother crystal 1) having average roughness Ra of 5 nm of the two main surfaces was sliced along a plane that is parallel with the {22-42} plane (along a plane perpendicular to the <22-42> direction) so as to cut out a plurality of GaN mother crystal pieces 1p each having a main surface of {22-42}, the main surfaces of the crystal pieces were ground and polished, and resultant GaN mother crystal pieces 1p having average roughness Ra of 5 nm of respective main surfaces were used. Referring to FIG. 7 (C), main surface 20pm of {22-42} of GaN single crystal substrate 20p has inclination angle α of 73° relative to a (0001) plane.

As to the photoelasticity distortion value in main surface 10pm of resultant GaN seed crystal substrate 10p, the average value was $3.3\times10^{-5}$, the minimum value was $1.5\times10^{-5}$, and the maximum value was $1.02\times10^{-4}$. Therefore, the photoelasticity distortion value in the main surface was a large value of $1.02\times10^{-4}$ or less, and the variation relative to the average value was also a large variation of −55% to +209%.

In contrast, as to the photoelasticity distortion value in main surface 20pm of resultant GaN single crystal substrate 20p, the average value was $3.2\times10^{-5}$, the minimum value was $1.1\times10^{-5}$, and the maximum value was $4.9\times10^{-5}$. Therefore, the photoelasticity distortion value in the main surface was a small value of $4.9\times10^{-5}$ or less, and the variation relative to the average was also a small variation of −65.6% to +53.1%. Further, in the whole of main surface 20pm of GaN single crystal substrate 20p, x-ray diffraction rocking curve measurement where (0002) and (20-20) planes were crystal planes of diffraction was performed and a half width of the x-ray diffraction peak was a small half width of 30 arc sec to 100 arc sec. Thus, main surface 20pm of GaN single crystal substrate 20p had high crystallinity.

Further, this GaN single crystal substrate 20p was used to manufacture LEDs that are each a GaN-based semiconductor device, similarly to Example C1. As to the brightness of the main surfaces of the manufactured LEDs (GaN-based semiconductor devices 100), the LEDs had a large average relative brightness of 0.92 and a small sample variance of the relative brightness of 0.16. The results are summarized in Table 3.

Example C4

Referring to FIG. 5 (A) to (D) and FIG. 6 (A) to (C), GaN seed crystal substrate 10p having main surface 10pm with the plane orientation of {22-4-2} and GaN single crystal substrate 20p having main surface 20pm with the plane orientation of {22-4-2} were formed similarly to Example C1 except that, in the step of preparing GaN seed crystal substrate 10p, GaN mother crystal C (GaN mother crystal 1) having average roughness Ra of 5 nm of the two main surfaces was sliced along a plane that is parallel with the {22-4-2} plane (along a plane perpendicular to the <22-4-2> direction) so as to cut out a plurality of GaN mother crystal pieces 1p each having a main surface of {22-4-2}, the main surfaces of the crystal pieces were ground and polished, and resultant GaN mother crystal pieces 1p having average roughness Ra of 5 nm of respective main surfaces were used. Referring to FIG. 7 (D), main surface 20pm of {22-4-2} of GaN single crystal substrate 20p has inclination angle α of 73° relative to a (000-1) plane.

As to the photoelasticity distortion value in main surface 10pm of resultant GaN seed crystal substrate 10p, the average value was $2.9 \times 10^{-5}$, the minimum value was $1.0 \times 10^{-5}$, and the maximum value was $9.8 \times 10^{-5}$. Therefore, the photoelasticity distortion value in the main surface was a large value of $9.8 \times 10^{-5}$ or less, and the variation relative to the average value was also a large variation of −66% to +238%.

In contrast, as to the photoelasticity distortion value in main surface 20pm of resultant GaN single crystal substrate 20p, the average value was $2.1 \times 10^{-5}$, the minimum value was $6.6 \times 10^{-6}$, and the maximum value was $3.9 \times 10^{-5}$. Therefore, the photoelasticity distortion value in the main surface was a small value of $3.9 \times 10^{-5}$ or less, and the variation relative to the average was also a small variation of −68.6% to +85.7%. Further, in the whole of main surface 20pm of GaN single crystal substrate 20p, x-ray diffraction rocking curve measurement where (0002) and (20-20) planes were crystal planes of diffraction was performed and a half width of the x-ray diffraction peak was a small half width of 30 arc sec to 100 arc sec. Thus, main surface 20pm of GaN single crystal substrate 20p had high crystallinity.

Further, this GaN single crystal substrate 20p was used to manufacture LEDs that are each a GaN-based semiconductor device, similarly to Example C1. As to the brightness of the main surfaces of the manufactured LEDs (GaN-based semiconductor devices 100), the LEDs had a large average relative brightness of 0.95 and a small sample variance of the relative brightness of 0.13. The results are summarized in Table 3.

Comparative Example RC1

Referring to FIG. 5 (A) to (D) and FIG. 6 (A) to (C), GaN seed crystal 10 was grown similarly to Example C1 except that, in the step of preparing GaN seed crystal substrate 10p, GaN mother crystal C (GaN mother crystal 1) having average roughness Ra of 5 nm of the two main surfaces was sliced along a plane that is parallel with the {10-10} plane (along a plane perpendicular to the <10-10> direction) so as to cut out a plurality of GaN mother crystal pieces 1p each having a main surface of {10-10}, the main surfaces of the crystal pieces were ground and polished, and resultant GaN mother crystal pieces 1p having average roughness Ra of 5 nm of respective main surfaces were used. GaN seed crystal 10 was partially polycrystallized and cracked from the polycrystallized portion. Therefore, a GaN seed crystal substrate could not be obtained and thus a GaN single crystal substrate and a GaN-based semiconductor device could not be manufactured. The results are summarized in Table 3.

Comparative Example RC2

Referring to FIG. 5 (A) to (D) and FIG. 6 (A) to (C), GaN seed crystal 10 was grown similarly to Example C1 except that, in the step of preparing GaN seed crystal substrate 10p, GaN mother crystal C (GaN mother crystal 1) having average roughness Ra of 5 nm of the two main surfaces was sliced along a plane that is parallel with the {11-20} plane (along a plane perpendicular to the <11-20> direction) so as to cut out a plurality of GaN mother crystal pieces 1p each having a main surface of {11-20}, the main surfaces of the crystal pieces were ground and polished, and resultant GaN mother crystal pieces 1p having average roughness Ra of 5 nm of respective main surfaces were used. GaN seed crystal 10 was partially polycrystallized and cracked from the polycrystallized portion. Therefore, a GaN seed crystal substrate could not be obtained and thus a GaN single crystal substrate and a GaN-based semiconductor device could not be manufactured. The results are summarized in Table 3.

Comparative Example RC3

Referring to FIG. 5 (A) to (D) and FIG. 6 (A) to (C), GaN seed crystal substrate 10p having main surface 10pm with the plane orientation of {10-11} and GaN single crystal substrate 20p having main surface 20pm with the plane orientation of {110-11} were formed similarly to Example C1 except that, in the step of preparing GaN seed crystal substrate 10p, GaN mother crystal C (GaN mother crystal 1) having average roughness Ra of 5 nm of the two main surfaces was sliced along a plane that is parallel with the (10-11) plane (along a plane perpendicular to the <10-11> direction) so as to cut out a plurality of GaN mother crystal pieces 1p each having a main surface of {10-11}, the main surfaces of the crystal pieces were ground and polished, and resultant GaN mother crystal pieces 1p having average roughness Ra of 5 nm of respective main surfaces were used. Main surface 20pm of {10-11} of GaN single crystal substrate 20p has inclination angle α of 62° relative to a (0001) plane.

As to the photoelasticity distortion value in main surface 10pm of resultant GaN seed crystal substrate 10p, the average value was $1.02 \times 10^{-4}$, the minimum value was $4.2 \times 10^{-5}$, and the maximum value was $2.6 \times 10^{-4}$. Therefore, the photoelasticity distortion value in the main surface was a large value of $2.6 \times 10^{-4}$ or less, and the variation relative to the average was also a large variation of −59% to +155%.

Further, as to the photoelasticity distortion in main surface 20pm of resultant GaN single crystal substrate 20p, the average value was $9.1 \times 10^{-5}$, the minimum value was $3.7 \times 10^{-5}$, and the maximum value was $2.5 \times 10^{-4}$. Therefore, the photoelasticity distortion value in the main surface was a large value of $2.5 \times 10^{-4}$ or less, and the variation relative to the average was also a large variation of −59.3% to +175%. In the whole of main surface 20pm of GaN single crystal substrate 20p, x-ray diffraction rocking curve measurement where (0002) and (22-40) planes were crystal planes of diffraction was performed and a half width of the x-ray diffraction peak was a large half width of 120 arc sec to 350 arc sec. Thus, main surface 20pm of GaN single crystal substrate 20p had low crystallinity.

Further, this GaN single crystal substrate 20p was used to manufacture LEDs that are each a GaN-based semiconductor device, similarly to Example C1. As to the brightness of the main surfaces of the manufactured LEDs (GaN-based semiconductor devices 100), the LEDs had a small average relative brightness of 0.76 and a large sample variance of the relative brightness of 0.25. The results are summarized in Table 3.

Comparative Example RC4

Referring to FIG. 5 (A) to (D) and FIG. 6 (A) to (C), GaN seed crystal substrate 10p having main surface 10pm with the plane orientation of {11-22} and GaN single crystal substrate 20p having main surface 20pm with the plane orientation of {11-22} were formed similarly to Example C1 except that, in the step of preparing GaN seed crystal substrate 10p, GaN mother crystal C (GaN mother crystal 1) having average roughness Ra of 5 nm of the two main surfaces was sliced along a plane that is parallel with the {11-22} plane (along a plane perpendicular to the <11-22> direction) so as to cut out a plurality of GaN mother crystal pieces 1p each having a main surface of {11-22}, the main surfaces of the crystal pieces were ground and polished, and resultant GaN mother crystal pieces 1p having average roughness Ra of 5 nm of respective main surfaces were used. Main surface 20pm of {11-22} of GaN single crystal substrate 20p has inclination angle α of 58° relative to a (0001) plane.

As to the photoelasticity distortion value in main surface 10pm of resultant GaN seed crystal substrate 10p, the average value was $1.21 \times 10^{-4}$, the minimum value was $5.6 \times 10^{-5}$, and the maximum value was $3.3 \times 10^{-4}$. Therefore, the photoelasticity distortion value in the main surface was a large value of $3.3 \times 10^{-4}$ or less, and the variation relative to the average was also a large variation of −54% to +173%.

Further, as to the photoelasticity distortion in main surface 20pm of resultant GaN single crystal substrate 20p, the average value was $1.0 \times 10^{-4}$, the minimum value was $4.1 \times 10^{-5}$, and the maximum value was $3.1 \times 10^{-4}$. Therefore, the photoelasticity distortion value in the main surface was a large value of $3.1 \times 10^{-4}$ or less, and the variation relative to the average was also a large variation of −59.0% to +210%. In the whole of main surface 20pm of GaN single crystal substrate 20p, x-ray diffraction rocking curve measurement where (0002) and (20-20) planes were crystal planes of diffraction was performed and a half width of the x-ray diffraction peak was a large half width of 120 arc sec to 350 arc sec. Thus, main surface 20pm of GaN single crystal substrate 20p had low crystallinity.

Further, this GaN single crystal substrate 20p was used to manufacture LEDs that are each a GaN-based semiconductor device, similarly to Example C1. As to the brightness of the main surfaces of the manufactured LEDs (GaN-based semiconductor devices 100), the LEDs had a small average relative brightness of 0.79 and a large sample variance of the relative brightness of 0.24. The results are summarized in Table 3.

TABLE 3

|  |  |  | Example C1 | Example C2 | Example C3 | Example C4 | Comparative Example RC1 | Comparative Example RC2 | Comparative Example RC3 | Comparative Example RC4 |
|---|---|---|---|---|---|---|---|---|---|---|
| GaN seed crystal substrate | plane orientation of main surface | | {20-21} | {20-2-1} | {22-42} | {22-4-2} | {10-10} | {11-20} | {10-11} | {11-22} |
| | inclination angle α (°) | | 75 | 75 | 73 | 73 | 90 | 90 | 62 | 58 |
| | photoelasticity distortion value | average ($\times 10^{-6}$) | 21 | 19 | 33 | 29 | partially polycrystallized, cracked | partially polycrystallized, cracked | 102 | 121 |
| | | min ($\times 10^{-6}$) | 0.49 | 0.32 | 15 | 10 | | | 42 | 56 |
| | | max ($\times 10^{-6}$) | 74 | 65 | 102 | 98 | | | 260 | 330 |
| | | variation (%) | −98 to +252 | −98 to +242 | −55 to +209 | −66 to +238 | | | −59 to +155 | −54 to +173 |
| GaN single crystal substrate | plane orientation of main surface | | {20-21} | {20-2-1} | {22-42} | {22-4-2} | | | {10-11} | {11-22} |
| | inclination angle α (°) | | 75 | 75 | 73 | 73 | | | 62 | 58 |
| | photoelasticity distortion value | average ($\times 10^{-6}$) | 8.3 | 5.4 | 32 | 21 | | | 91 | 100 |
| | | min ($\times 10^{-6}$) | 0.26 | 0.11 | 11 | 6.6 | | | 37 | 41 |
| | | max ($\times 10^{-6}$) | 15 | 9.4 | 49 | 39 | | | 250 | 310 |
| | | variation (%) | −96.9 to +80.7 | −98.0 to 74.1 | −65.6 to +53.1 | −68.6 to +85.7 | | | −59.3 to +175 | −59.0 to +210 |
| | x-ray diffraction | diffraction crystal plane | (0002) (22-40) | (0002) (22-40) | (0002) (20-20) | (0002) (20-20) | | | (0002) (22-40) | (0002) (20-20) |
| | | half width of peak (arcsec) | 30 to 100 | 30 to 100 | 30 to 100 | 30 to 100 | | | 120 to 350 | 120 to 350 |
| GaN-based semiconductor device | relative brightness | average | 1.0 | 1.1 | 0.92 | 0.95 | | | 0.76 | 0.79 |
| | | sample variance | 0.15 | 0.11 | 0.16 | 0.13 | | | 0.25 | 0.24 |

As clearly seen from Table 3, a GaN single crystal substrate, which has a main surface of the plane orientation inclined by not less than 65° and not more than 85° with respect to one of a (0001) plane and a (000-1) plane, and has a photoelasticity distortion value of not more than $5 \times 10^{-5}$ where the photoelasticity distortion value is measured by photoelasticity at an arbitrary point within the main surface when light is applied perpendicularly to the main surface at an ambient temperature of 25° C., could be used to obtain a GaN-based semiconductor device having a large average emission intensity of the main surface and a substantially uniform distribution of the emission intensity in the main surface (the sample variance of the relative brightness with respect to the average relative brightness in the main surface is 0.2 or less and thus the variation of the emission intensity relative to the average emission intensity is small).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A GaN single crystal substrate having a main surface with an area of not less than 10 cm$^2$, said main surface having a plane orientation inclined by not less than 65° and not more than 85° with respect to one of a (0001) plane and a (000-1) plane, and said substrate having at least one of a substantially uniform distribution of a carrier concentration in said main surface, a substantially uniform distribution of a dislocation density in said main surface, and a photoelasticity distortion value of not more than $5 \times 10^{-5}$, the photoelasticity distortion value being measured by photoelasticity at an arbitrary point in said main surface when light is applied perpendicularly to said main surface at an ambient temperature of 25° C.

2. The GaN single crystal substrate according to claim 1, wherein a variation of the carrier concentration in said main surface is within ±50% with respect to an average carrier concentration in said main surface.

3. The GaN single crystal substrate according to claim 1, wherein a distribution of a specific resistance in said main surface is substantially uniform.

4. The GaN single crystal substrate according to claim 3, wherein a variation of the specific resistance in said main surface is within ±50% with respect to an average specific resistance in said main surface.

5. The GaN single crystal substrate according to claim 3, wherein an average specific resistance in said main surface is not more than 0.1 Ωcm.

6. The GaN single crystal substrate according to claim 1, wherein a variation of the dislocation density in said main surface is within ±100% with respect to an average dislocation density in said main surface.

7. The GaN single crystal substrate according to claim 1, wherein the dislocation density in said main surface is not more than $5 \times 10^6$ cm$^{-2}$.

8. The GaN single crystal substrate according to claim 1, wherein a variation of said photoelasticity distortion value in said main surface is within ±100% with respect to an average value of said photoelasticity distortion value in said main surface.

9. The GaN single crystal substrate according to claim 1, wherein the plane orientation of said main surface is inclined in <10-10> direction with respect to one of the (0001) plane and the (000-1) plane.

10. The GaN single crystal substrate according to claim 1, wherein a half width of an x-ray diffraction peak obtained by x-ray diffraction rocking curve measurement for one of a combination of a (0002) plane and a (20-20) plane, and a combination of a (0002) plane and a (22-40) plane is not more than 300 arc sec in a whole of said main surface.

11. A method of manufacturing a GaN single crystal substrate as recited in claim 1, comprising the steps of: preparing a GaN seed crystal substrate having a main surface with an area of not less than 10 cm$^2$, said main surface having a plane orientation inclined by not less than 65° and not more than 85° with respect to one of a (0001) plane and a (000-1) plane; growing a GaN single crystal on said main surface of said GaN seed crystal substrate; and forming said GaN single crystal substrate by cutting said GaN single crystal along a plane that is parallel with said main surface of said GaN seed crystal substrate.

12. A GaN-based semiconductor device comprising a GaN single crystal substrate as recited in claim 1, and at least one GaN-based semiconductor layer formed on said main surface of said GaN single crystal substrate.

13. A method of manufacturing a GaN-based semiconductor device comprising the steps of: preparing a GaN single crystal substrate as recited in claim 1; and growing at least one GaN-based semiconductor layer on said main surface of said GaN single crystal substrate.

14. The GaN single crystal substrate according to claim 1, wherein the plane orientation is inclined by not less than 70° and not more than 80°.

15. The GaN single crystal substrate according to claim 1, wherein the plane orientation is inclined by not less than 72° and not more than 78°.

* * * * *